United States Patent
Matsuo et al.

(10) Patent No.: US 10,964,474 B2
(45) Date of Patent: Mar. 30, 2021

(54) CAPACITOR AND CAPACITOR MODULE

(71) Applicant: KABUSHIKI KAISHA TOSHIBA, Minato-ku (JP)

(72) Inventors: Keiichiro Matsuo, Yokohama (JP); Susumu Obata, Yokohama (JP); Mitsuo Sano, Yokohama (JP); Kazuhito Higuchi, Yokohama (JP); Kazuo Shimokawa, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/742,095

(22) Filed: Jan. 14, 2020

(65) Prior Publication Data

US 2020/0258682 A1    Aug. 13, 2020

(30) Foreign Application Priority Data

Feb. 7, 2019   (JP) .................................. 2019-020614

(51) Int. Cl.
*H01G 4/01*    (2006.01)
*H01G 4/008*   (2006.01)
(Continued)

(52) U.S. Cl.
CPC ............. *H01G 4/005* (2013.01); *H01G 4/228* (2013.01); *H01G 4/38* (2013.01); *H05K 1/181* (2013.01);
(Continued)

(58) Field of Classification Search
CPC ............ H01G 4/01; H01G 4/008; H01G 4/30; H01G 4/40; H01L 21/02; H01L 21/20;
(Continued)

(56) References Cited

U.S. PATENT DOCUMENTS 6,620,701 B2 * 9/2003 Ning .................... H01L 23/5223
257/E21.018
6,720,232 B1 * 4/2004 Tu ...................... H01L 27/10811
257/296
(Continued)

FOREIGN PATENT DOCUMENTS

CN        106169371 A    11/2016
JP      2000-323076 A    11/2000
(Continued)

OTHER PUBLICATIONS

Obata, S. et al. "A Novel Fabrication Process for High Density Silicon Capacitors by using Metal-Assisted Chemical Etching", IMAPS2019, 6 pages.

*Primary Examiner* — Xiaoliang Chen
(74) *Attorney, Agent, or Firm* — Oblon, McClelland, Maier & Neustadt, L.L.P.

(57) ABSTRACT

According to one embodiment, a capacitor includes a conductive substrate, a conductive layer, a dielectric layer, and first and second external electrodes. The conductive substrate has a first main surface provided with recess(es), a second main surface, and an end face extending between edges of the first and second main surfaces. The conductive layer covers the first main surface and side walls and bottom surfaces of the recess(s). The dielectric layer is interposed between the conductive substrate and the conductive layer. The first external electrode includes a first electrode portion facing the end face and is electrically connected to the conductive layer. The second external electrode includes a second electrode portion facing the end face and is electrically connected to the conductive substrate.

14 Claims, 17 Drawing Sheets

US 10,964,474 B2

Page 2

(51) Int. Cl.
| | |
|---|---|
| *H01G 4/30* | (2006.01) |
| *H01G 4/40* | (2006.01) |
| *H01L 21/02* | (2006.01) |
| *H01L 21/20* | (2006.01) |
| *H01L 21/311* | (2006.01) |
| *H01L 29/00* | (2006.01) |
| *H01L 29/92* | (2006.01) |
| *H01L 29/94* | (2006.01) |
| *H01L 49/02* | (2006.01) |
| *H01G 4/005* | (2006.01) |
| *H01G 4/228* | (2006.01) |
| *H05K 1/18* | (2006.01) |
| *H01G 4/38* | (2006.01) |

(52) U.S. Cl.
CPC .............. *H05K 2201/10015* (2013.01); *H05K 2201/10515* (2013.01)

(58) Field of Classification Search
CPC ....... H01L 21/311; H01L 29/00; H01L 29/92; H01L 29/94; H01L 49/02; H01L 49/94
USPC ....... 174/260; 29/25, 41; 361/277, 305, 312; 438/238, 253, 381, 386, 396, 957
See application file for complete search history.

(56) References Cited

U.S. PATENT DOCUMENTS

| | | | | |
|---|---|---|---|---|
| 6,853,024 | B1* | 2/2005 | Tu | H01L 27/10852 257/301 |
| 7,224,016 | B2* | 5/2007 | Nakamura | H01L 21/7687 257/296 |
| 8,125,050 | B2* | 2/2012 | Kageyama | H01L 27/0805 257/534 |
| 8,716,100 | B2* | 5/2014 | Tzeng | H01L 28/90 438/396 |
| 8,987,086 | B2* | 3/2015 | Ching | H01L 28/91 438/253 |
| 10,290,701 | B1* | 5/2019 | Chang | H01L 21/0228 |
| 2002/0074584 | A1* | 6/2002 | Yang | G11C 11/404 257/300 |
| 2003/0129805 | A1* | 7/2003 | Kim | H01L 28/91 438/386 |
| 2004/0051130 | A1* | 3/2004 | Miyajima | H01L 28/65 257/301 |
| 2004/0056324 | A1* | 3/2004 | Ning | H01L 23/5223 257/528 |
| 2004/0224474 | A1* | 11/2004 | Barth | H01L 28/40 438/396 |
| 2005/0063140 | A1* | 3/2005 | Hackler, Sr. | H01L 28/91 361/312 |
| 2005/0082586 | A1* | 4/2005 | Tu | H01L 28/60 257/296 |
| 2005/0227432 | A1* | 10/2005 | Choi | H01L 21/31122 438/244 |
| 2005/0275005 | A1* | 12/2005 | Choi | H01L 21/76841 257/300 |
| 2006/0024899 | A1* | 2/2006 | Crenshaw | H01L 23/5223 438/381 |
| 2006/0024902 | A1* | 2/2006 | Ajmera | H01L 28/75 438/387 |
| 2006/0046378 | A1* | 3/2006 | Choi | H01L 27/10817 438/238 |
| 2006/0234443 | A1* | 10/2006 | Yang | H01L 23/5329 438/253 |
| 2007/0273005 | A1* | 11/2007 | Hwang | H01L 28/40 257/532 |
| 2007/0275536 | A1* | 11/2007 | Cremer | H01L 28/91 438/381 |
| 2007/0296085 | A1* | 12/2007 | Coolbaugh | H01L 28/60 257/758 |
| 2008/0089007 | A1* | 4/2008 | Oladeji | H01L 21/76838 361/305 |
| 2008/0122032 | A1* | 5/2008 | Tu | H01L 28/91 257/532 |
| 2008/0179652 | A1* | 7/2008 | Sugioka | H01L 27/10852 257/306 |
| 2008/0239618 | A1* | 10/2008 | Cremer | H01L 28/91 361/302 |
| 2009/0065836 | A1* | 3/2009 | Kim | H01L 23/5223 257/296 |
| 2009/0294907 | A1* | 12/2009 | Tegen | H01L 28/86 257/535 |
| 2010/0213572 | A1* | 8/2010 | Ching | H01L 23/5223 257/532 |
| 2011/0031586 | A1* | 2/2011 | Kang | H01L 28/40 257/532 |
| 2011/0080686 | A1* | 4/2011 | Farcy | H01G 4/005 361/277 |
| 2011/0291166 | A1* | 12/2011 | Booth, Jr. | H01L 27/0629 257/296 |
| 2012/0181660 | A1* | 7/2012 | Fujiwara | H01L 27/10852 257/532 |
| 2013/0037910 | A1* | 2/2013 | Tzeng | H01L 23/49822 257/532 |
| 2013/0069200 | A1* | 3/2013 | Raghavan | H01L 28/90 257/532 |
| 2013/0337625 | A1* | 12/2013 | Fujiwara | H01L 21/0228 438/381 |
| 2014/0197519 | A1* | 7/2014 | Choi | H01L 28/92 257/534 |
| 2015/0008024 | A1* | 1/2015 | Park | H05K 1/181 174/260 |
| 2015/0022945 | A1* | 1/2015 | Park | H01G 4/30 361/301.4 |
| 2015/0145104 | A1 | 5/2015 | Bauer et al. | |
| 2015/0295020 | A1* | 10/2015 | Tseng | H01L 27/0805 257/532 |
| 2016/0181353 | A1* | 6/2016 | Ando | H01L 23/26 257/534 |
| 2016/0218172 | A1* | 7/2016 | Hsieh | H01L 28/90 |
| 2016/0260547 | A1* | 9/2016 | Park | H01G 4/005 |
| 2018/0019064 | A1* | 1/2018 | Han | H01G 4/30 |
| 2018/0301283 | A1* | 10/2018 | Tomizawa | H01G 4/12 |

FOREIGN PATENT DOCUMENTS

| | | |
|---|---|---|
| JP | 2007-095950 A | 4/2007 |
| JP | 2012-221990 A | 11/2012 |
| JP | 2015-111671 A | 6/2015 |
| TW | 201225122 A1 | 6/2012 |
| TW | 201248787 A1 | 12/2012 |
| TW | 201430885 A | 8/2014 |
| WO | WO 2017/217342 A1 | 12/2017 |
| WO | WO 2019/171470 A1 | 9/2019 |

\* cited by examiner

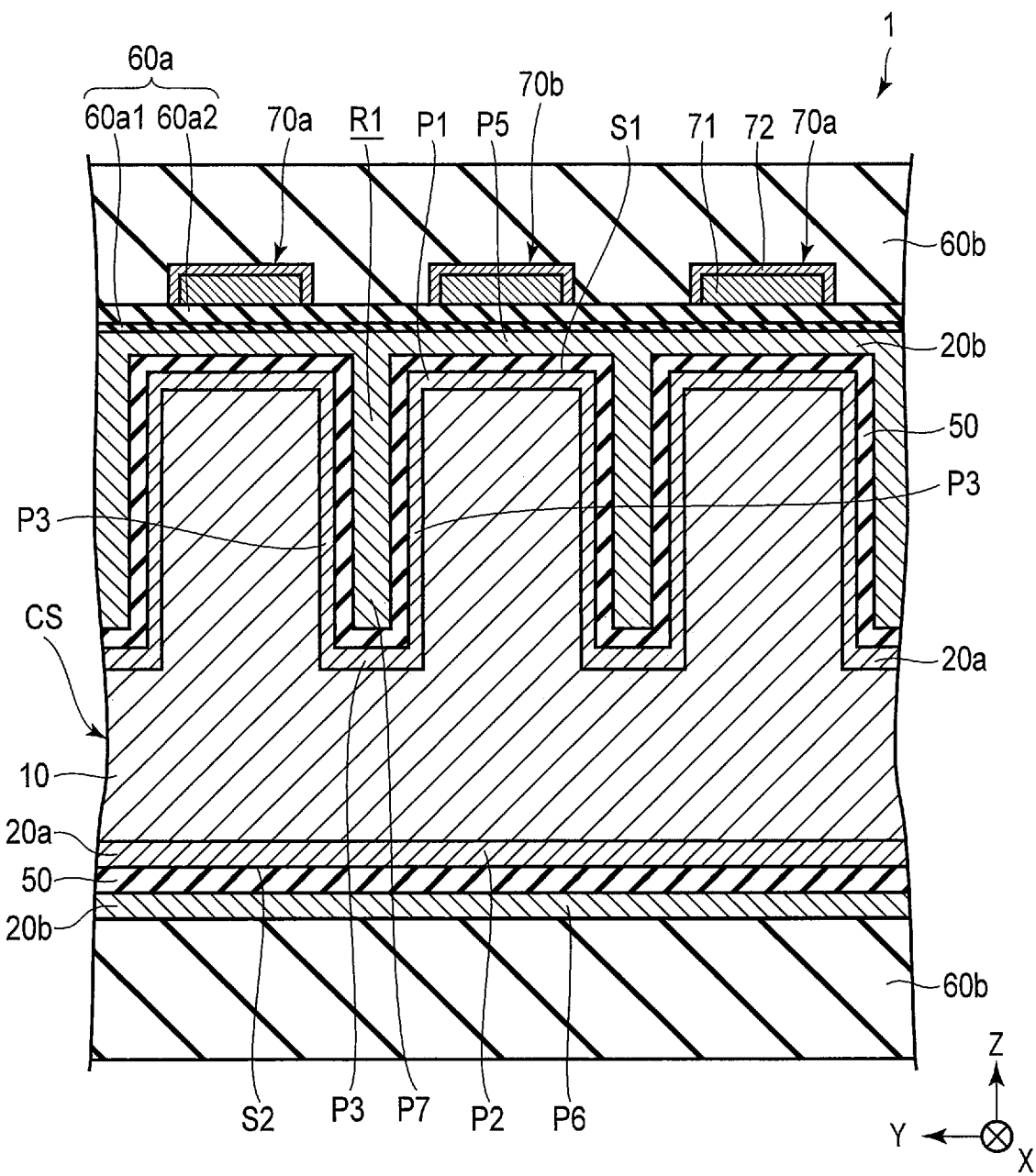
F I G. 4

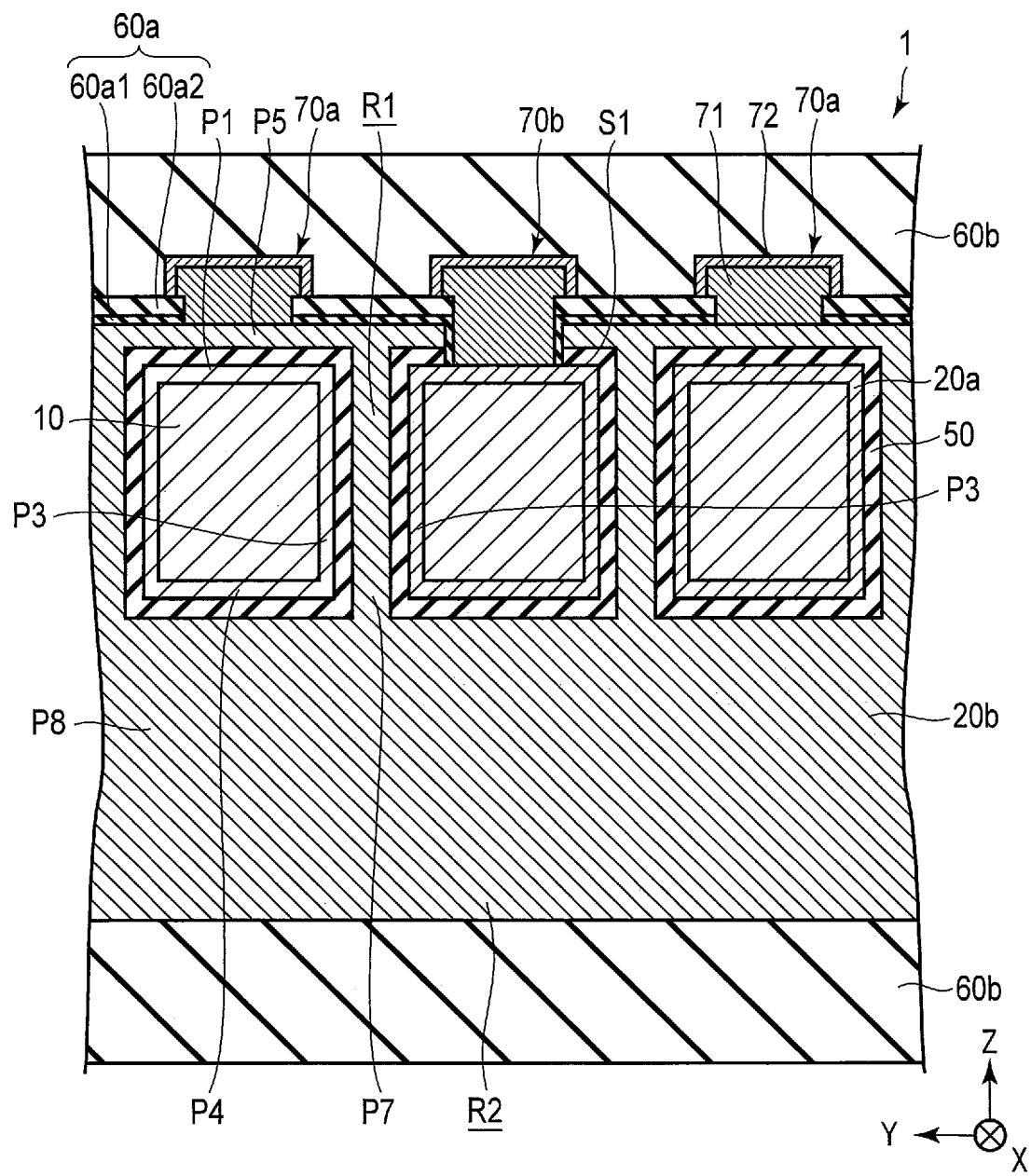
F I G. 6

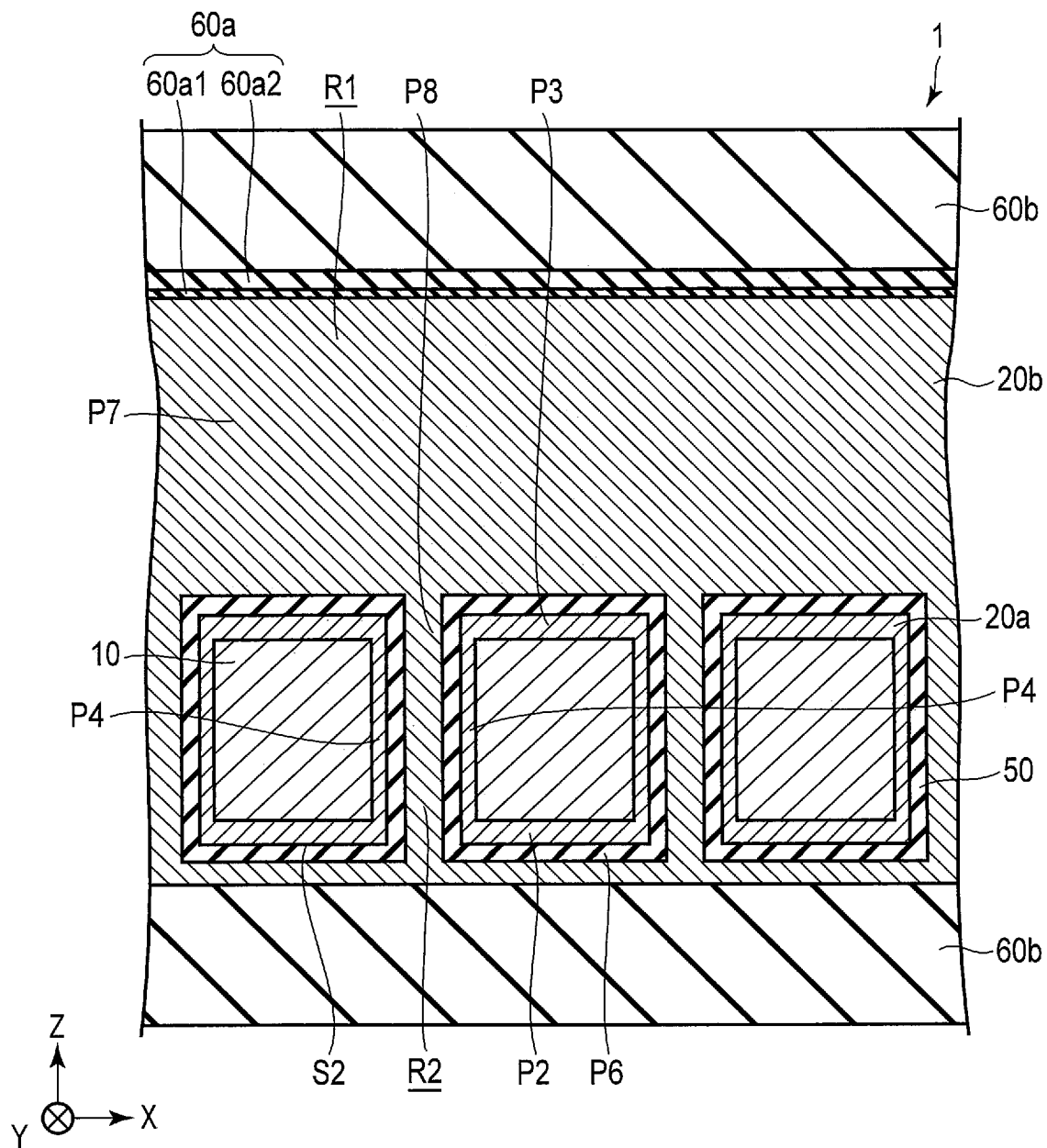
F I G. 7

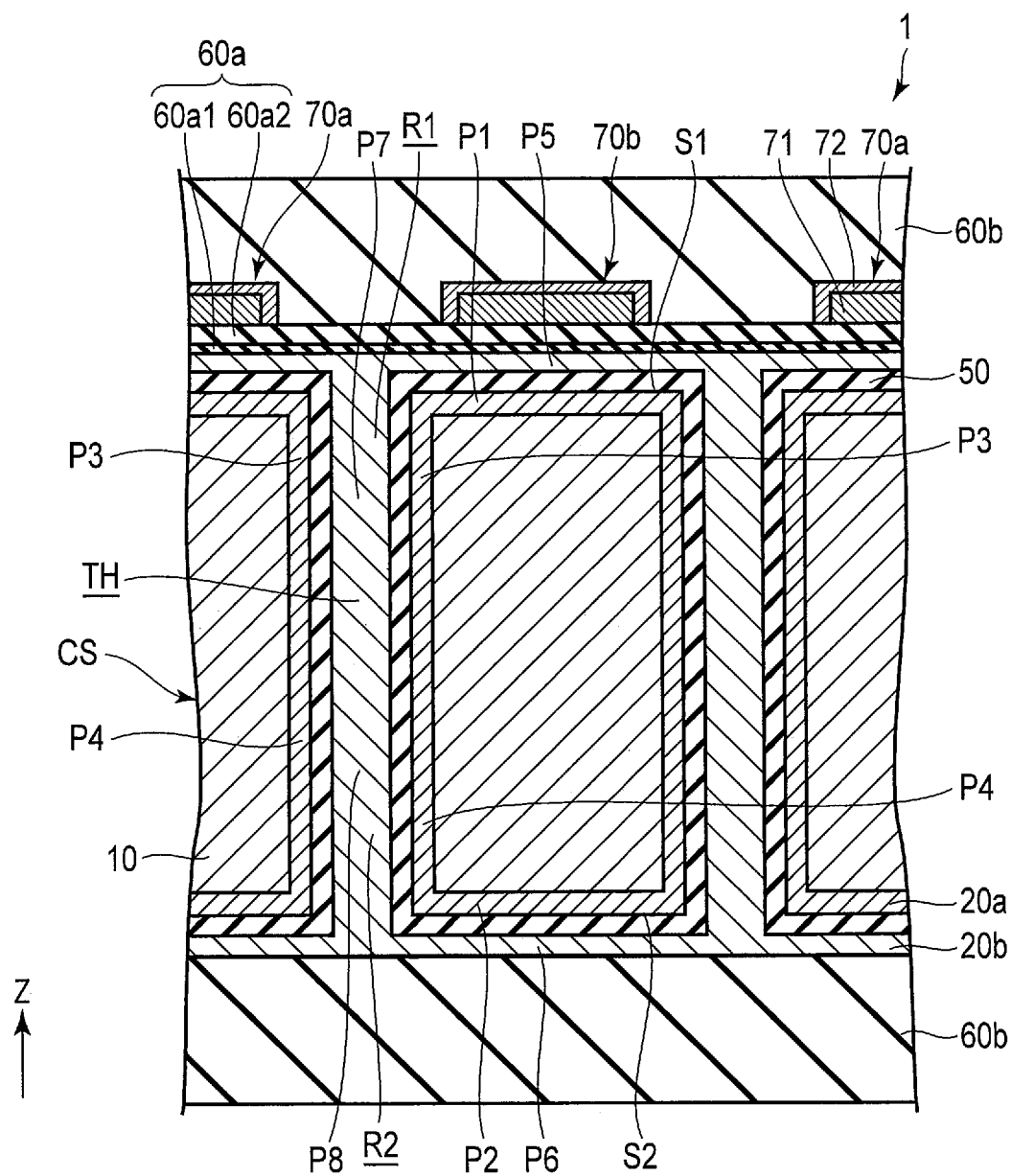
F I G. 8

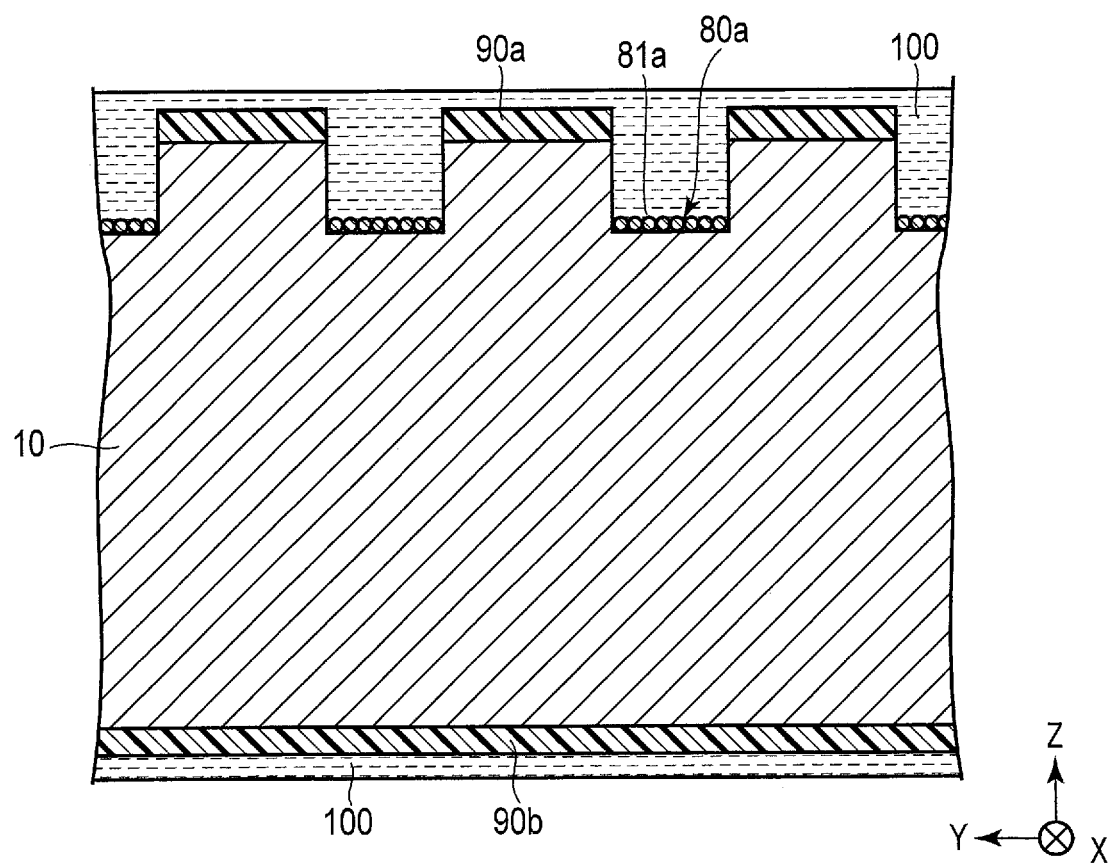
F I G. 13

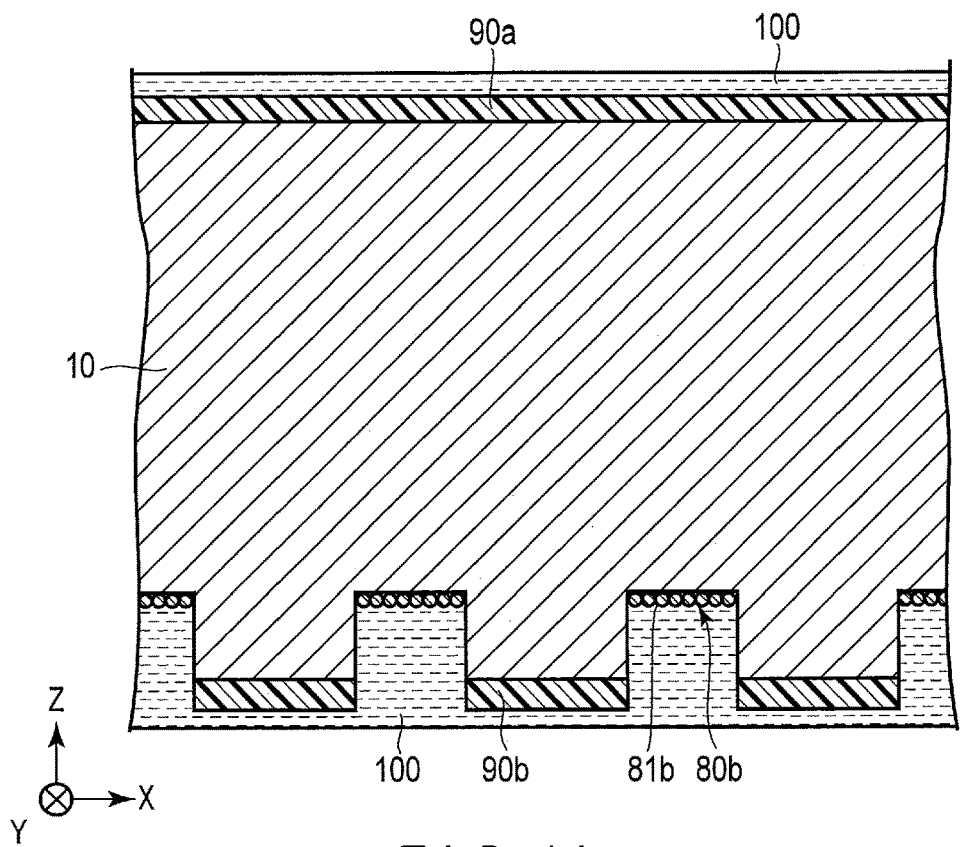
F I G. 14
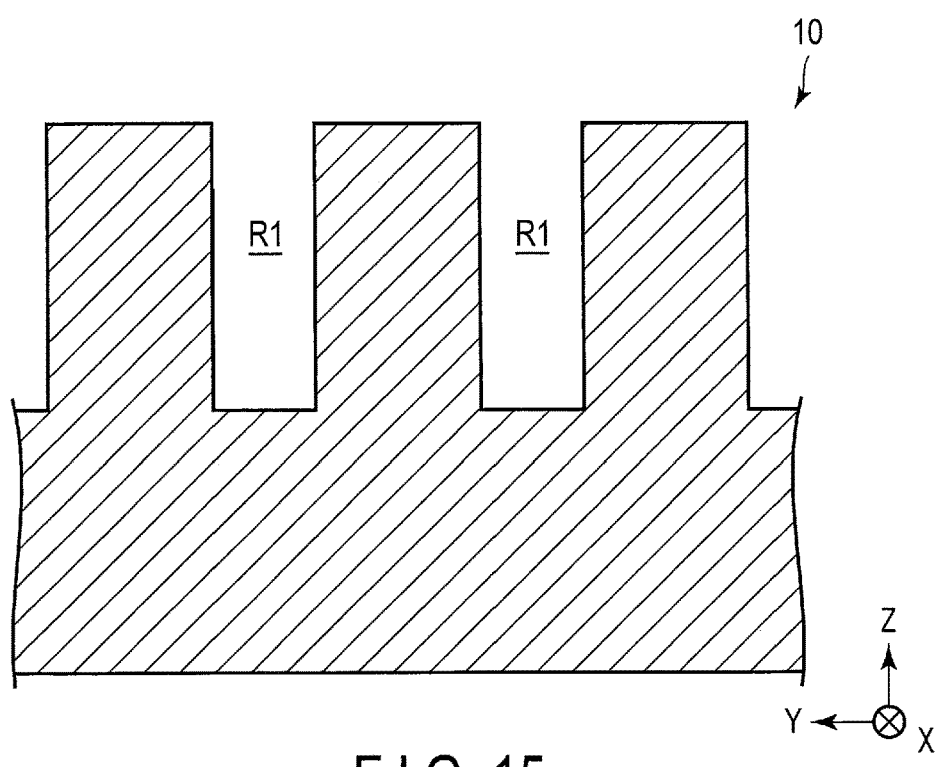
F I G. 15

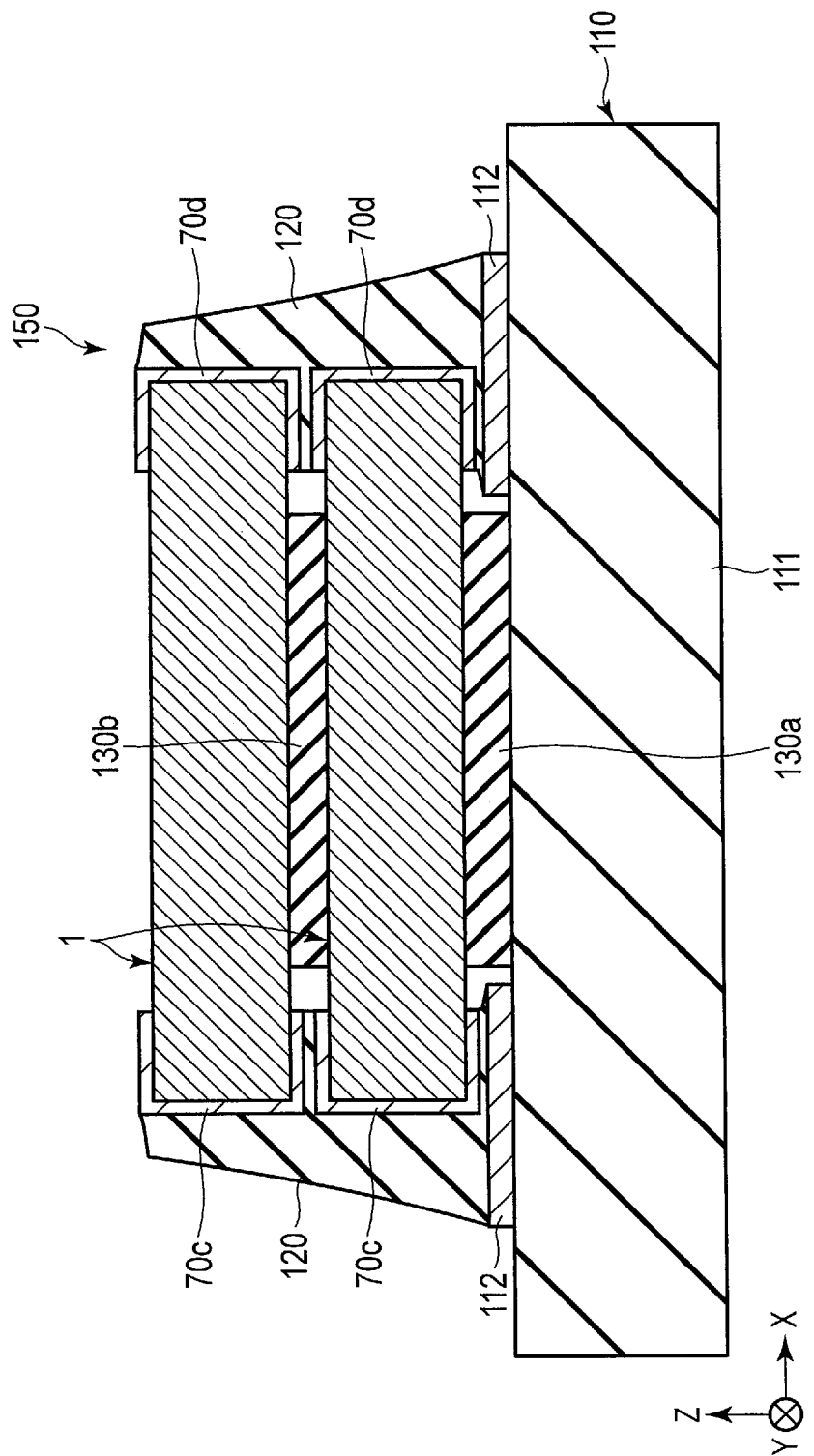
F I G. 18

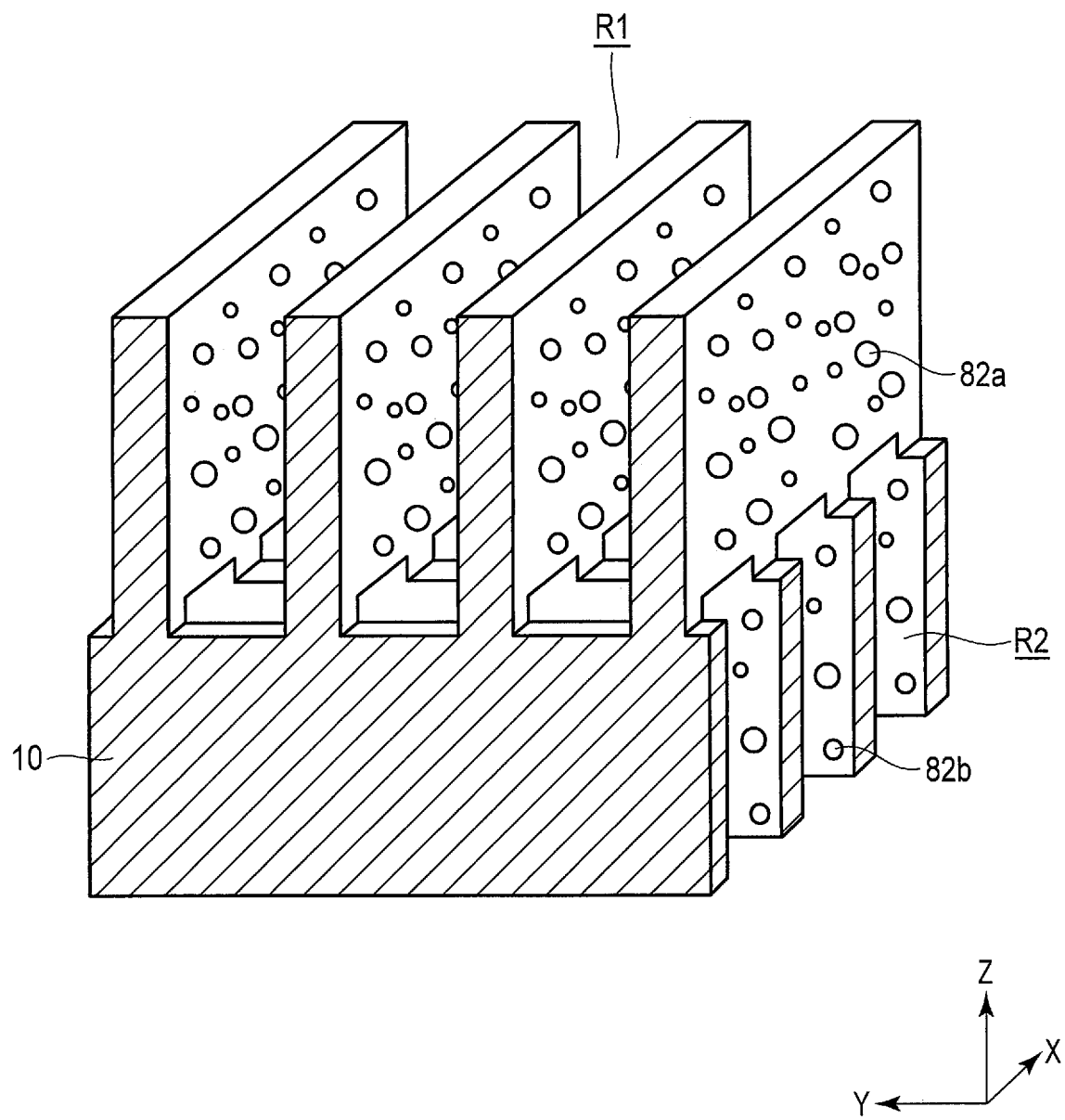
F I G. 20

CAPACITOR AND CAPACITOR MODULE

CROSS-REFERENCE TO RELATED APPLICATION

This application is based upon and claims the benefit of priority from Japanese Patent Application No. 2019-020614, filed Feb. 7, 2019, the entire contents of which are incorporated herein by reference.

FIELD

Embodiments described herein relate generally to a capacitor.

BACKGROUND

With the downsizing and upgrading of communication equipment, capacitors to be mounted thereon are desired to be smaller and thinner. As a structure to achieve downsizing and reducing the thickness of the capacitor while maintaining the capacitance density, there is a trench capacitor with an increased surface area made by forming trenches on a substrate.

BRIEF DESCRIPTION OF THE DRAWINGS

FIG. 4 is a cross-sectional view taken along a line IV-IV of the capacitor shown in FIG. 3;

FIG. 6 is a cross-sectional view taken along a line VI-VI of the capacitor shown in FIG. 3;

FIG. 7 is a cross-sectional view taken along a line VII-VII of the capacitor shown in FIG. 3;

FIG. 8 is a cross-sectional view taken along a line VIII-VIII of the capacitor shown in FIG. 3;

FIG. 13 is a cross-sectional view showing still another process in the manufacture of the capacitor shown in FIGS. 1 to 10;

FIG. 14 is a cross-sectional view showing still another process in the manufacture of the capacitor shown in FIGS. 1 to 10;

FIG. 15 is a cross-sectional view showing a structure obtained by the processes of FIGS. 13 and 14;

FIG. 18 is a cross-sectional view showing an example of a capacitor module including the capacitor shown in FIGS. 1 to 10;

FIG. 20 is a perspective view showing a process in the manufacture of the capacitor according to the second embodiment.

DETAILED DESCRIPTION

Figure 1:
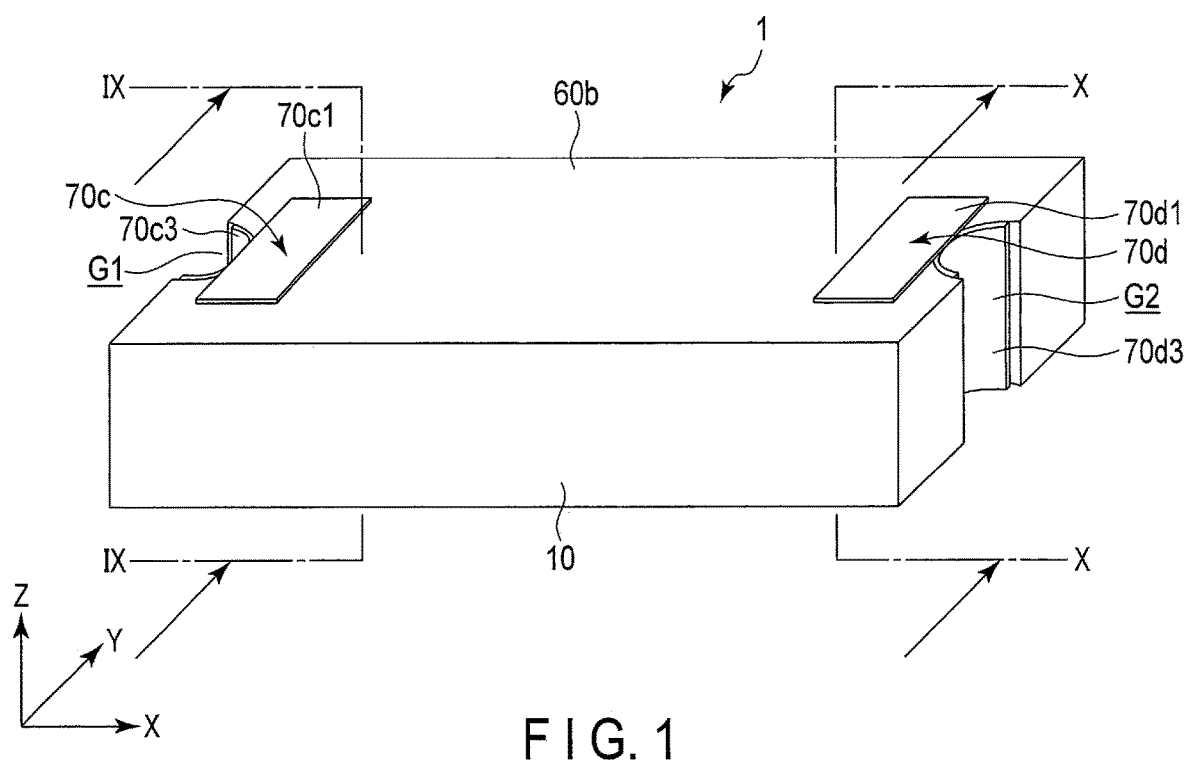
FIG. 1 is a perspective view of a capacitor according to a first embodiment as observed diagonally above.

A capacitor according to a first aspect comprises: a conductive substrate having a first main surface, a second main surface, and an end face extending from an edge of the first main surface to an edge of the second main surface, the first main surface being provided with one or more recesses; a conductive layer covering the first main surface and side walls and bottom surfaces of the one or more recesses; a dielectric layer interposed between the conductive substrate and the conductive layer; a first external electrode including a first electrode portion that faces the end face, the first external electrode being electrically connected to the conductive layer; and a second external electrode including a second electrode portion that faces the end face, the second external electrode being electrically connected to the conductive substrate.

A capacitor according to a second aspect comprises: a conductive substrate having a first main surface and a second main surface, the first main surface being provided with one or more recesses; a conductive layer covering the first main surface and side walls and bottom surfaces of the one or more recesses; a dielectric layer interposed between the conductive substrate and the conductive layer; a first external electrode including first and second bonding pads respectively facing the first and second main surfaces, the first external electrode being electrically connected to the conductive layer; and a second external electrode including third and fourth bonding pads respectively facing the first and second main surfaces, the second external electrode being electrically connected to the conductive substrate.

A capacitor module according to a third aspect comprises: a stacked body including a plurality of capacitors stacked one on top of another, each of the plurality of capacitors being the capacitor according to the first or second aspect, and two adjacent ones of the plurality of capacitors being such that the first external electrodes are electrically connected to each other and the second external electrodes are electrically connected to each other; and a circuit substrate supporting the stacked body.

A capacitor module according to a fourth aspect comprises: a stacked body including a plurality of capacitors stacked one on top of another, each of the plurality of capacitors being the capacitor according to the first aspect; a circuit substrate supporting the stacked body; a bonding material provided to be in contact with the first electrode portions of the plurality of capacitors and electrically connecting the first electrode portions together; and a bonding material provided to be in contact with the second electrode portions of the plurality of capacitors and electrically connecting the second electrode portions together.

Embodiments will be explained in detail below with reference to the accompanying drawings. Note that the same reference numerals denote constituent elements which achieve the same or similar functions throughout all the drawings, and a repetitive explanation will be omitted.

First Embodiment

FIGS. 1 to 10 show a capacitor according to a first embodiment.

A capacitor 1 shown in FIGS. 1 to 10 includes a conductive substrate CS, a conductive layer 20b, and a dielectric layer 50, as shown in FIGS. 4 to 10.

In each figure, an X direction is a direction parallel to a main surface of the conductive substrate CS, and a Y direction is a direction parallel to the main surface of the conductive substrate CS and perpendicular to the X direction. In addition, a Z direction is a thickness direction of the conductive substrate CS, i.e., a direction perpendicular to the X direction and the Y direction.

The conductive substrate CS is a substrate having electrical conductivity at least in its surface. The conductive substrate CS includes a first main surface S1, a second main surface S2, and end faces S3 each extending from an edge of the first main surface S1 to an edge of the second main surface S2. Here, the conductive substrate CS has a flat and approximately rectangular parallelepiped shape. The conductive substrate CS may have another shape.

Figure 3:
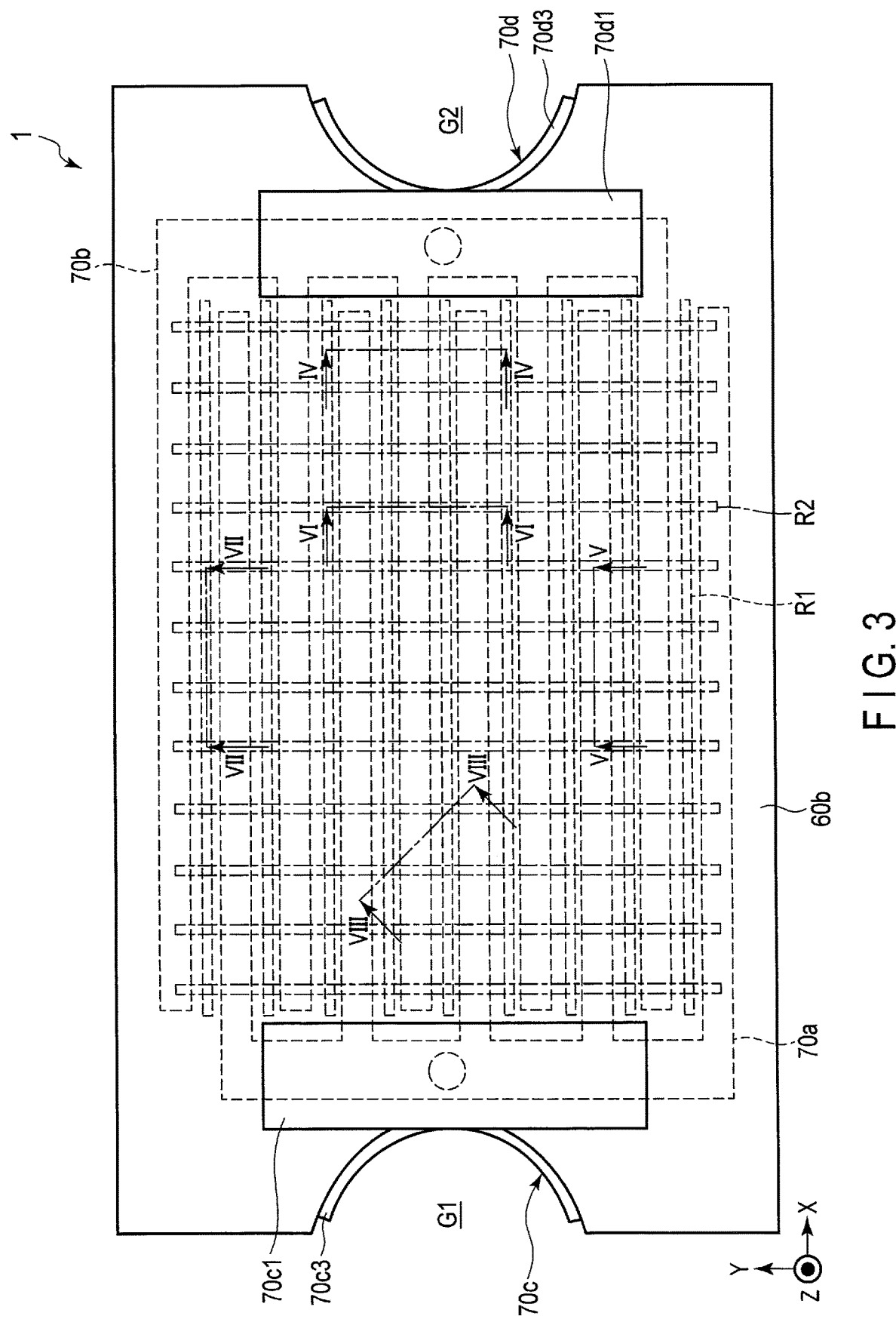
FIG. 3 is a top view of the capacitor shown in FIGS. 1 and 2.

The first main surface S1 is provided with first recesses R1 shown in FIGS. 3, 4, and 6 to 8. Here, these first recesses R1 are first trenches each having a shape extending in the X direction as a first direction. As shown in FIGS. 3, 4, and 6, the recesses R1 are arranged in the Y direction as a second direction. A plurality of first recesses R1 may be provided or only one first recess R1 may be provided on the first main surface S1.

Figure 5:
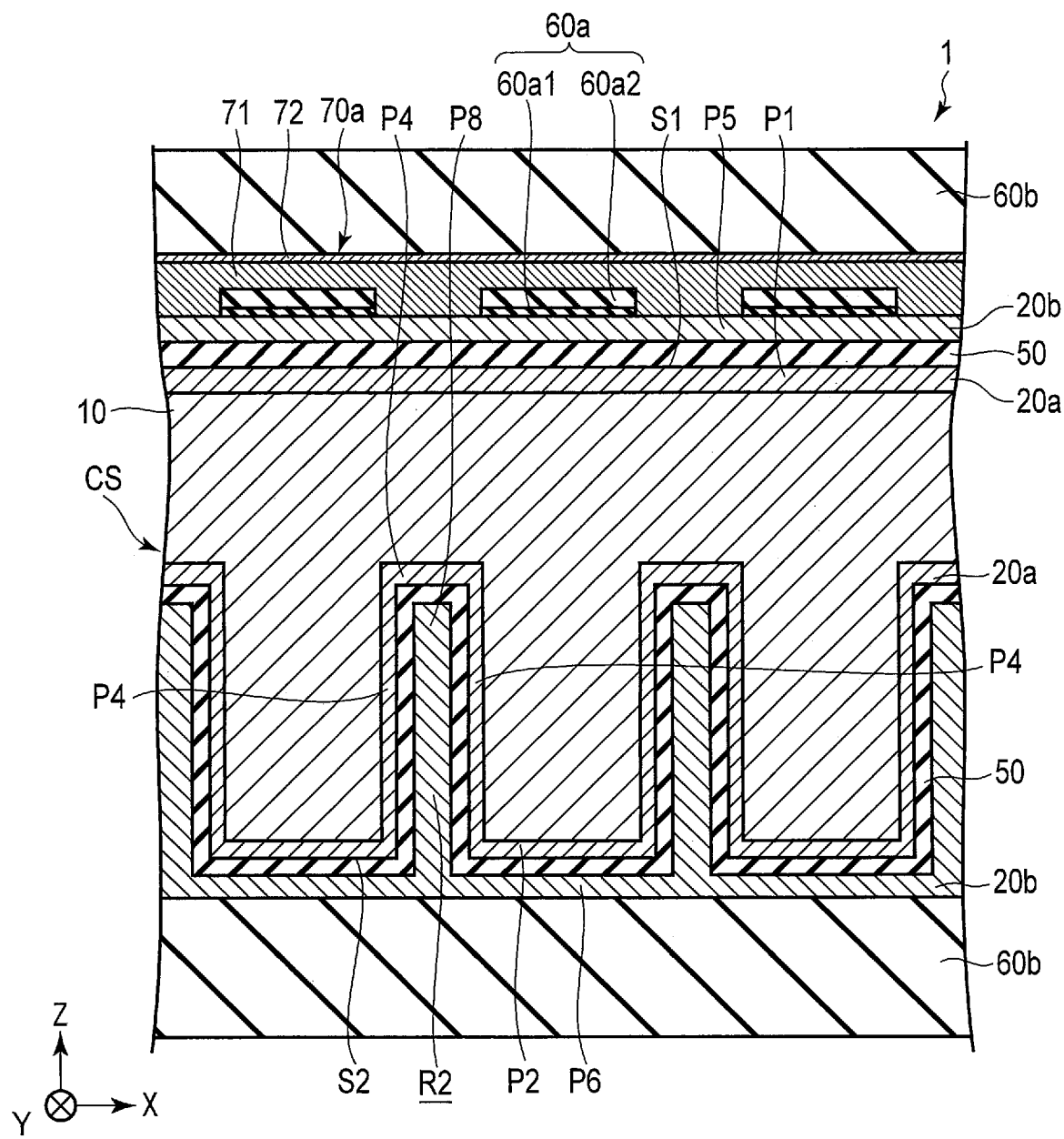
FIG. 5 is a cross-sectional view taken along a line V-V of the capacitor shown in FIG. 3.
Figure 9:
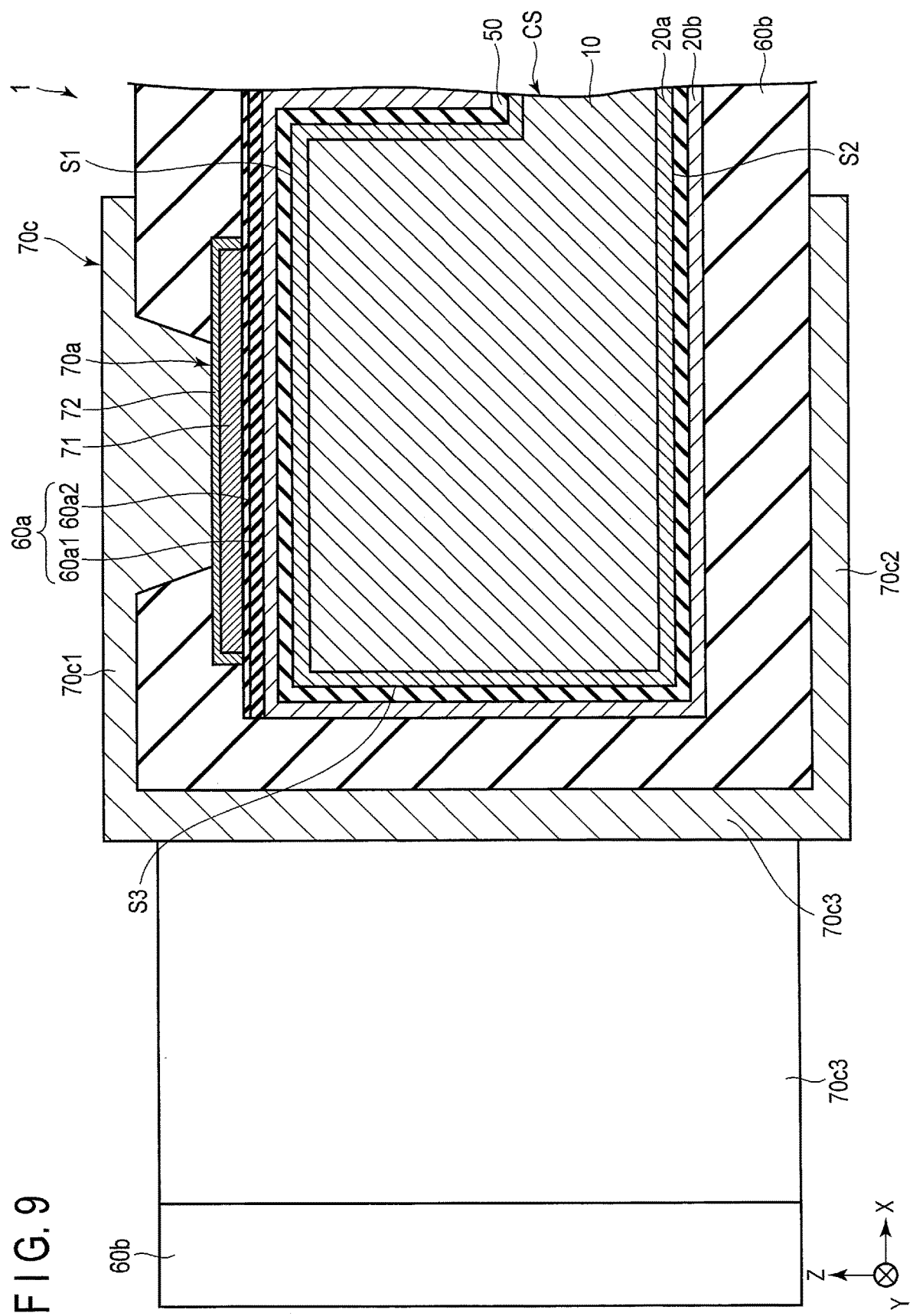
FIG. 9 is a cross-sectional view taken along a line IX-IX of the capacitor shown in FIGS. 1 and 2.
Figure 10:
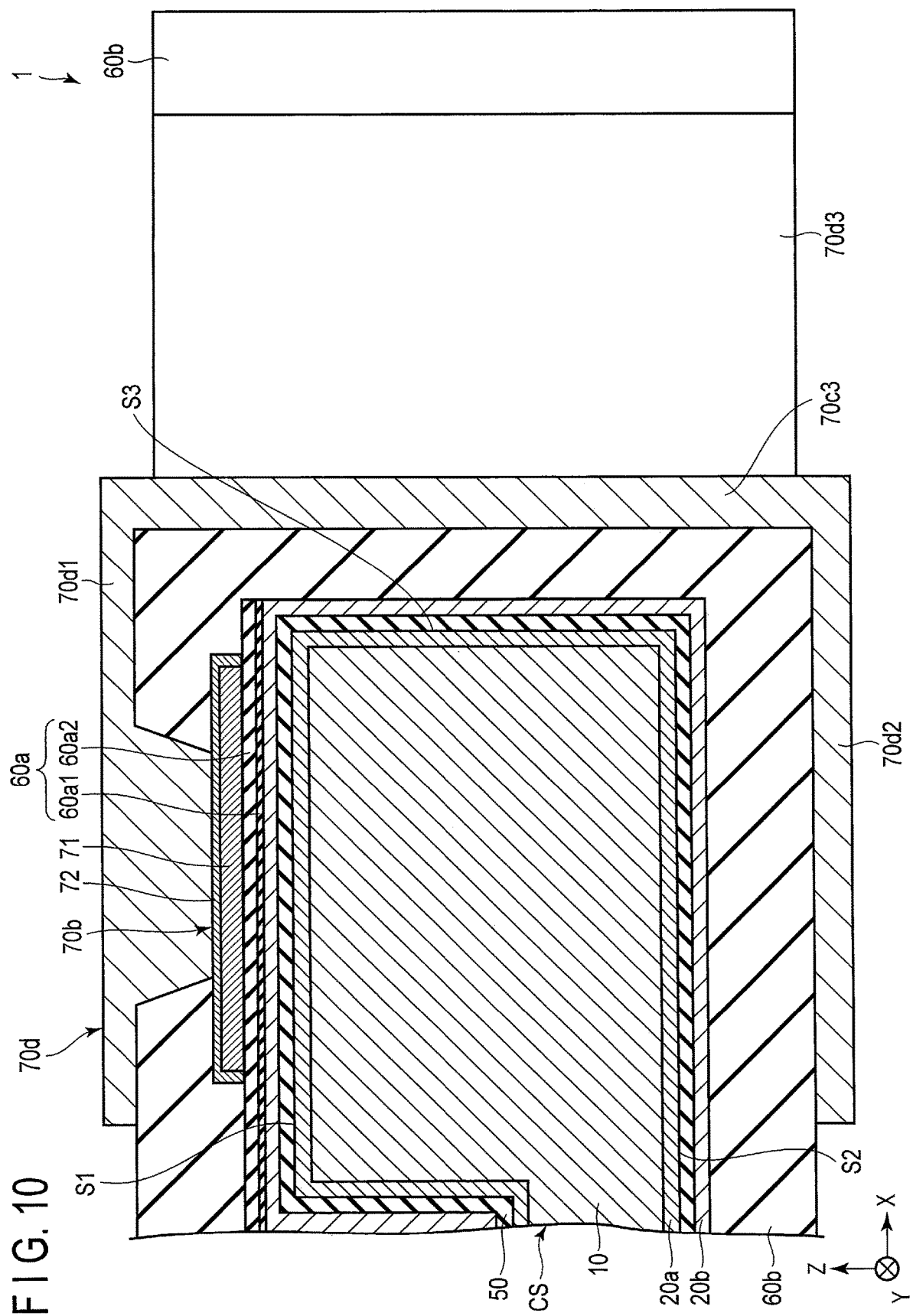
FIG. 10 is a cross-sectional view taken along a line X-X of the capacitor shown in FIGS. 1 and 2.

The second main surface S2 is provided with second recesses R2 shown in FIGS. 3, 5, and 6 to 8. Here, these second recesses R2 are second trenches each having a shape extending in the Y direction as a second direction. As shown in FIGS. 3, 5, and 7, the second recesses R2 are arranged in the X direction as the first direction. A plurality of second recesses R2 may be provided or only one second recess R2 may be provided on the second main surface S2.

A length direction of the first recesses R1 and a length direction of the second recesses R2 intersect each other. Here, the length direction of the first recesses R1 and the length direction of the second recesses R2 are orthogonal to each other. The length direction of the first recesses R1 and the length direction of the second recesses R2 may intersect diagonally.

The "length direction" of the first or second recesses is a length direction of orthogonal projections of the first or second recesses onto a plane perpendicular to a thickness direction of the conductive substrate CS. Accordingly, the fact that the length direction of the first recesses R1 and the length direction of the second recesses R2 intersect each other means that the length direction of the orthogonal projections of the first recesses onto the plane perpendicular to the thickness direction of the conductive substrate CS intersects the length direction of the orthogonal projections of the second recesses onto this plane.

A sum of a depth D1 of the first recesses R1 and a depth D2 of the second recesses R2, D1+D2, is equal to or greater than a thickness T of the conductive substrate CS. If this configuration is adopted, the first recesses R1 and the second recesses R2 are connected to each other at positions where they intersect to form through holes TH shown in FIG. 8.

A ratio of the sum D1+D2 to the thickness T, (D1+D2)/T, is preferably within a range of 1 to 1.4, and more preferably within a range of 1.1 to 1.3. From the viewpoint of increasing the electric capacitance, the ratio (D1+D2)/T is preferably large. In addition, from the viewpoint of improving an electrical connection between portions of the conductive layer 20b that are located on side walls and bottom surfaces of the first recesses R1 and portions of the conductive layer 20b that are located on side walls and bottom surfaces of the second recesses R2, the ratio (D1+D2)/T is preferably large. However, when the depths D1 and D2 are increased, the mechanical strength of the capacitor 1 decreases.

Note that the ratio (D1+D2)/T may be less than 1. In this case, the first recesses R1 and the second recesses R2 do not form the through holes TH shown in FIG. 8 at the positions where they intersect. Therefore, in this case, in addition to providing the first recesses R1 and the second recesses R2, through holes are provided at any positions of the substrate 10. In this case, one either or both of the first recesses R1 and the second recesses R2 can be omitted.

The depth D1 of the first recesses R1 and the depth D2 of the second recesses R2 may depend on the thickness T of the conductive substrate CS, but is within a range of 0.1 μm to 500 μm according to an example, and within a range of 1 μm to 400 μm according to another example.

It is preferable that a dimension of an opening of each of the first recess R1 and the second recess R2 is 0.3 μm or more. Note that the dimensions of the openings of the first recesses R1 and the second recesses R2 are diameters or widths of the openings of the first recesses R1 and the second recesses R2. Herein, the dimension of the opening of each of the first recesses R1 and the second recesses R2 is a dimension in a direction perpendicular to the length directions thereof. When these dimensions are reduced, a larger electric capacitance can be achieved. However, if these dimensions are reduced, it becomes difficult to form a stacked structure including the dielectric layer 50 and the conductive layer 20b in the first recesses R1 and the second recesses R2.

A distance between adjacent first recesses R1 and a distance between adjacent second recesses R2 are each preferably 0.1 μm or more. When these distances are reduced, a larger electric capacitance can be achieved. However, when these distances are reduced, a portion of the conductive substrate CS sandwiched between the first recesses R1 and a portion of the conductive substrate CS sandwiched between the second recesses R2 are likely to be damaged.

The first recesses R1 and the second recesses R2 can have various shapes. For example, as long as orthogonal projections of the first recesses R1 and the second recesses R2 onto a plane perpendicular to the Z direction intersect each other, they may each have a curved or bent shape, or may each be circular or square.

Herein, cross sections of the first recesses R1 and the second recesses R2 parallel to the depth directions are rectangular. These cross sections may not be rectangular. For example, these cross sections may have a tapered shape.

The through holes TH are arranged corresponding to intersections of the first recesses R1 and the second recesses R2. Each of the through holes TH is constituted by a part of the first recess R1 and a part of the second recess R2. Each of the through holes TH extends from the first main surface S1 to the second main surface S2. That is, each of the through holes TH extends in the Y direction, which is the thickness direction of the conductive substrate CS.

Figure 2:
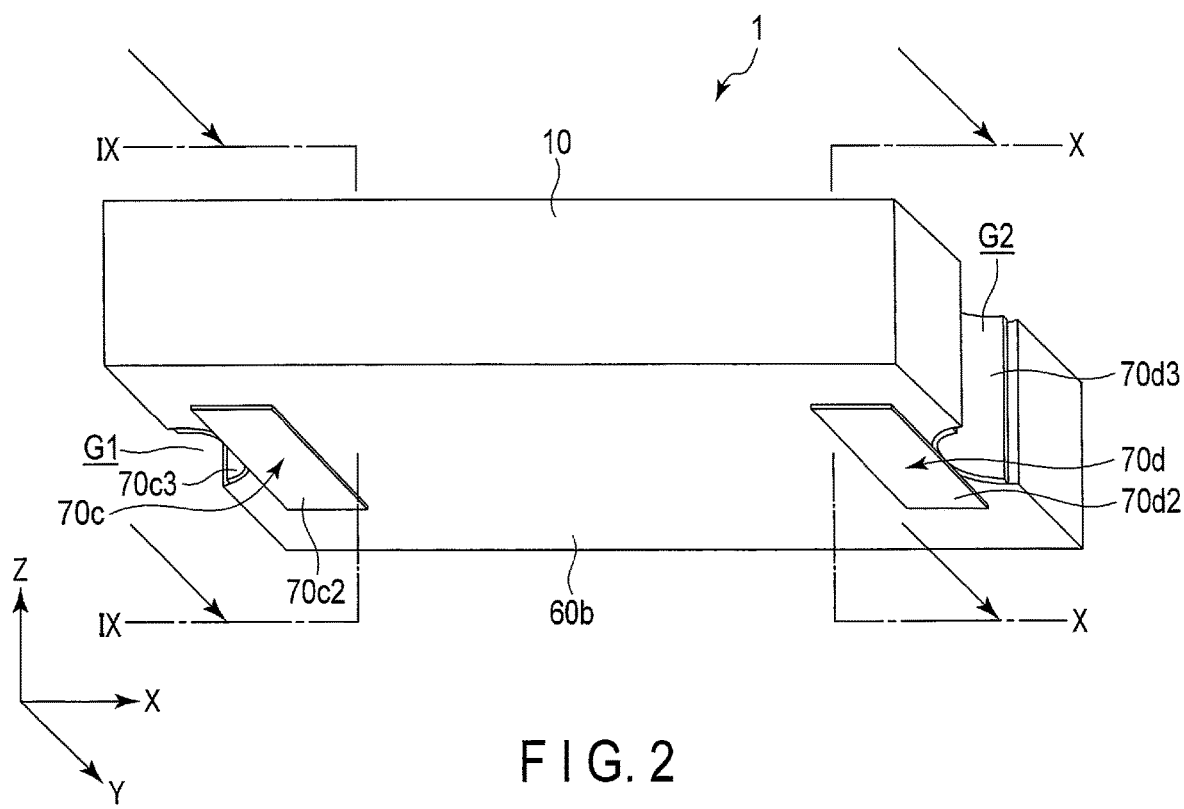
FIG. 2 is a perspective view of the capacitor shown in FIG. 1 as observed diagonally below.

The end faces S3 of the conductive substrate CS are provided with a first groove G1 and a second groove G2 shown in FIGS. 1 to 3. Each of the first groove G1 and the second groove G2 extends from an edge of the first main surface S1 to an edge of the second main surface S2.

As shown in FIGS. 4 to 10, the conductive substrate CS includes the substrate 10 and the conductive layer 20a.

The substrate 10 has a shape similar to that of the conductive substrate CS. The substrate 10 is, for example, an insulating substrate, a semiconductor substrate, or a conductive substrate. The substrate 10 is preferably a semiconductor substrate. The substrate 10 is preferably a substrate containing silicon such as a silicon substrate. Such a substrate can be processed using a semiconductor process.

The conductive layer 20a is provided on the substrate 10. For example, the conductive layer 20a is made of polysilicon doped with impurities to improve electrical conductivity, or a metal or alloy such as molybdenum, aluminum, gold, tungsten, platinum, nickel, or copper. The conductive layer 20a may have a single-layer structure or a multi-layer structure.

A thickness of the conductive layer 20a is preferably within a range of 0.05 μm to 1 μm, and more preferably within a range of 0.1 μm to 0.3 μm. If the conductive layer 20a is thin, there is a possibility that a discontinuous portion may be generated in the conductive layer 20a, or a sheet resistance of the conductive layer 20a may be excessively increased. When the conductive layer 20a is thickened, a manufacturing cost increases.

The conductive layer 20a includes a first portion P1 shown in FIGS. 4 to 6 and 8, a second portion P2 shown in FIGS. 4, 5, 7, and 8, third portions P3 shown in FIGS. 4 and 6 to 8, and fourth portions P4 shown in FIGS. 5 to 8. The first portion P1 is a portion of the conductive layer 20a that corresponds to the first main surface S1. The second portion P2 is a portion of the conductive layer 20a that corresponds to the second main surface S2. The third portions P3 are portions of the conductive layer 20a that are adjacent to the first recesses R1. The fourth portions P4 are portions of the conductive layer 20a that are adjacent to the second recesses R2.

The first portion P1 and the third portions P3 are electrically connected together, as can be seen from FIGS. 4, 6, and 8. The second portion P2 and the fourth portions P4 are also electrically connected together, as can be seen from FIGS. 5, 7, and 8. The third portions P3 and the fourth portions P4 are electrically connected together at the positions of the through holes TH shown in FIG. 8.

In the case where the substrate 10 is a semiconductor substrate such as a silicon substrate, the conductive layer 20a may be a high-concentration doped layer that is a surface region of the semiconductor substrate doped with impurities at a high concentration.

If the substrate 10 has high electrical conductivity, the conductive layer 20a may be omitted, and the substrate 10 may be used as the conductive substrate CS. For example, if the substrate 10 is a semiconductor substrate made of a semiconductor doped with P-type or N-type impurities, or a metal substrate, the conductive layer 20a can be omitted. In this case, at least a surface region of the substrate 10, e.g. the entire substrate 10, serves as the conductive layer 20a.

The conductive layer 20b covers the first main surface S1, the second main surface S2, the end faces S3, the side walls and the bottom surfaces of the first recesses R1, and the side walls and the bottom surfaces of the second recesses R2. Portions of the conductive layer 20b that cover the end faces S3 may be omitted.

For example, the conductive layer 20b is made of polysilicon doped with impurities to improve the electrical conductivity, or a metal or alloy such as molybdenum, aluminum, gold, tungsten, platinum, nickel, or copper. The conductive layer 20b may have a single-layer structure or a multi-layer structure.

The thickness of the conductive layer 20b is preferably within a range of 0.05 μm to 1 μm, and more preferably within a range of 0.1 μm to 0.3 μm. If the conductive layer 20b is thin, there is a possibility that a discontinuous portion may be generated in the conductive layer 20b, or a sheet resistance of the conductive layer 20b may be excessively increased. If the conductive layer 20b is thick, it may be difficult to form the conductive layer 20a and the dielectric layer 50 with sufficient thicknesses.

The conductive layer 20b includes a fifth portion P5 shown in FIGS. 4 to 6 and 8, a sixth portion P6 shown in FIGS. 4, 5, 7, and 8, seventh portions P7 shown in FIGS. 4 and 6 to 8, and eighth portions P8 shown in FIGS. 5 to 8. The fifth portion P5 is a portion of the conductive layer 20b that faces the first portion P1. The sixth portion P6 is a portion of the conductive layer 20b that faces the second portion P2. The seventh portions P7 are portions of the conductive layer 20b that face the third portions P3. The eighth portions P8 are portions of the conductive layer 20b that face the fourth portions P4.

The fifth portion P5 and the seventh portions P7 are electrically connected together, as can be seen from FIGS. 4, 6, and 8. The sixth portion P6 and the eighth portions P8 are also electrically connected together, as can be seen from FIGS. 5, 7, and 8. The seventh portions P7 and the eighth portions P8 are electrically connected together at the positions of the through holes TH shown in FIG. 8.

In FIGS. 4 to 10, the conductive layer 20b is provided so that the first recesses R1 and the second recesses R2 are completely filled with the conductive layer 20b and the dielectric layer 50. The conductive layer 20b may be a layer that is conformal to a surface of the conductive substrate CS. That is, the conductive layer 20b may be a layer having an approximately uniform thickness. In this case, the first recesses R1 and the second recesses R2 are not completely filled with the conductive layer 20b and the dielectric layer 50.

The conductive layer 20b is provided with a plurality of through holes. Here, these through holes are provided in a portion of the conductive layer 20b that faces the first main surface S1 with the dielectric layer 50 interposed therebetween, at positions corresponding to intersections of the second recesses R2 and regions each sandwiched between two adjacent first recesses R1 such that the through holes are arranged every other position in the Y direction. The conductive layer 20b may be provided with through holes at other positions. Further, the conductive layer 20b may be provided with only one through hole.

The dielectric layer 50 is interposed between the conductive substrate CS and the conductive layer 20b. The dielectric layer 50 is a layer that is conformal to the surface of the conductive substrate CS. The dielectric layer 50 electrically insulates the conductive substrate CS and the conductive layer 20b from each other.

The dielectric layer 50 is made of, for example, an organic dielectric or an inorganic dielectric. As the organic dielectric, for example, polyimide can be used. As the inorganic dielectric, a ferroelectric can be used. Paraelectrics, such as silicon nitride, silicon oxide, silicon oxynitride, titanium oxide, and tantalum oxide, are preferable. These paraelectrics have a small change in dielectric constant with temperature. Therefore, when the paraelectrics are used for the dielectric layer 50, the heat resistance of the capacitor 1 can be improved.

A thickness of the dielectric layer 50 is preferably within a range of 0.005 μm to 0.5 μm, and more preferably within a range of 0.01 μm to 0.1 μm. When the dielectric layer 50 is thin, there is a possibility that a discontinuous portion may be generated in the dielectric layer 50, and the conductive substrate CS and the conductive layer 20b may be short-circuited. Further, if the dielectric layer 50 is thinned, a withstand voltage is lowered even if there is no short circuit, and a possibility of short-circuiting when a voltage is applied is increased. When the dielectric layer 50 is thickened, the withstand voltage increases, but the electric capacitance decreases.

The dielectric layer 50 is provided with a plurality of through holes. The through holes of the dielectric layer 50 are connected to the through holes of the conductive layer 20b.

This capacitor 1 further includes an insulating layer 60a shown in FIGS. 4 to 10, first comb-shaped electrodes 70a and second comb-shaped electrodes 70b shown in FIGS. 3 to 6 and 8 to 10, an insulating layer 60b shown in FIGS. 4 to 10, and a first external electrode 70c and a second external electrode 70d shown in FIGS. 1 to 3, 9, and 10.

The insulating layer 60a faces the first main surface S1 with a part of the conductive layer 20b and a part of the dielectric layer 50 interposed therebetween. Specifically, the insulting layer 60a covers the fifth portion P5 and the seventh portions P7 of the conductive layer 20b.

The insulating layer 60a includes a first insulating layer 60a1 and a second insulating layer 60a2.

The first insulting layer 60a1 covers the fifth portion P5 and the seventh portions P7 of the conductive layer 20b. The first insulating layer 60a1 further covers side walls of the through holes provided in the conductive layer 20b, and side walls of the through holes provided in the dielectric layer 50. The first insulating layer 60a1 is made of, for example, an inorganic insulator such as silicon nitride and silicon oxide.

The second insulating layer 60a2 covers the first insulating layer 60a1. The second insulating layer 60a2 is made of, for example, an organic insulator such as polyimide and novolac resin.

The insulating layer 60a may have a multi-layer structure or a single-layer structure.

The insulating layer 60a is provided with a plurality of through holes. Some of these through holes are connected to the through holes provided in the dielectric layer 50 via the through holes provided in the conductive layer 20b, and together with them, form second contact holes. The rest of the through holes provided in the insulating layer 60a are each provided at an intermediate position of the second contact holes adjacent in the Y direction to form first contact holes.

The first comb-shaped electrode 70a is provided on the insulating layer 60a. The first comb-shaped electrode 70a is an internal electrode. The first comb-shaped electrode 70a includes comb tooth portions each extending in the X direction and arranged in the Y direction. The first comb-shaped electrode 70a fills the first contact holes. The first comb-shaped electrode 70a is electrically connected to the conductive layer 20b.

The second comb-shaped electrode 70b is provided on the insulating layer 60a. The second comb-shaped electrode 70b is an internal electrode. The second comb-shaped electrode 70b includes comb tooth portions each extending in the X direction and arranged in the Y direction. The comb tooth portions of the second comb-shaped electrode 70b and the comb tooth portions of the first comb-shaped electrode 70a are arranged alternately in the Y direction. The second comb-shaped electrode 70b fills the second contact holes. The second comb-shaped electrode 70b is electrically connected to the conductive layer 20a.

The first comb-shaped electrode 70a and the second comb-shaped electrode 70b may each have a single-layer structure or a multi-layer structure. Each layer constituting the first comb-shaped electrode 70a and the second comb-shaped electrode 70b is made of a metal such as copper, titanium, nickel, or a nickel alloy.

The insulating layer 60b faces the first main surface S1, with a part of the conductive layer 20b, a part of the dielectric layer 50, the first comb-shaped electrode 70a, and the second comb-shaped electrode 70b interposed therebetween. Furthermore, the insulating layer 60b faces the second main surface S2 and the end faces S3, with another part of the conductive layer 20b and another part of the dielectric layer 50 interposed therebetween.

The insulating layer 60b may have a single-layer structure or a multi-layer structure. A layer constituting the insulating layer 60b is made of, for example, an inorganic insulator such as silicon nitride, or an organic insulator such as polyimide.

The insulating layer 60b is provided with a plurality of through holes at the positions of the first comb-shaped electrode 70a and the second comb-shaped electrode 70b. Of these through holes, one provided at the position of the first comb-shaped electrode 70a is a third contact hole. On the other hand, of these through holes, one provided at the position of the second comb-shaped electrode 70b is a fourth contact hole.

The first external electrode 70c is provided on the insulating layer 60b. The first external electrode 70c is electrically connected to the conductive layer 20b via the first comb-shaped electrode 70a.

The first external electrode 70c includes a first bonding pad 70c1, a second bonding pad 70c2, and a first electrode portion 70c3.

The first bonding pad 70c1 faces the first main surface S1, with a part of the dielectric layer 50, a part of the conductive layer 20b, a part of the insulating layer 60a, a part of the first comb-shaped electrode 70a, and a part of the insulating layer 60b interposed therebetween. The first bonding pad 70c1 is adjacent to an end of the first groove G1.

The first bonding pad 70c1 fills the third contact hole. The first bonding pad 70c1 is electrically connected to the first comb-shaped electrode 70a. In addition, the first bonding pad 70c1 is connected to an end of the first electrode portion 70c3.

The second bonding pad 70c2 faces the second main surface S2, with another part of the dielectric layer 50, another part of the conductive layer 20b, another part of the insulating layer 60a, and another part of the insulating layer 60b interposed therebetween. The second bonding pad 70c2 is adjacent to the other end of the first groove G1. The second bonding pad 70c2 is connected to the other end of the first electrode portion 70c3.

The first electrode portion 70c3 faces the end face S3, with still another part of the dielectric layer 50, still another part of the conductive layer 20b, and still another part of the insulating layer 60b interposed therebetween. The first electrode portion 70c3 has a shape conformal to a wall of the first groove G1.

The second external electrode 70d is provided on the insulating layer 60b. The second external electrode 70d is electrically connected to the conductive substrate CS via the second comb-shaped electrode 70b.

The second external electrode 70d includes a third bonding pad 70d1, a fourth bonding pad 70d2, and a second electrode portion 70d3.

The third bonding pad 70d1 faces the first main surface S1, with a part of the dielectric layer 50, a part of the conductive layer 20b, a part of the insulating layer 60a, a part of the second comb-shaped electrode 70b, and a part of the insulating layer 60b interposed therebetween. The third bonding pad 70d1 is adjacent to an end of the second groove G2.

The third bonding pad 70d1 fills the fourth contact hole. The third bonding pad 70d1 is electrically connected to the second comb-shaped electrode 70b. In addition, the third bonding pad 70d1 is connected to an end of the second electrode portion 70d3.

The fourth bonding pad 70d2 faces the second main surface S2, with another part of the dielectric layer 50, another part of the conductive layer 20b, another part of the insulating layer 60a, and another part of the insulating layer 60b interposed therebetween. The fourth bonding pad 70d2 is adjacent to the other end of the second groove G2. The fourth bonding pad 70d2 is connected to the other end of the second electrode portion 70d3.

The second electrode portion 70d3 faces the end face S3, with still another part of the dielectric layer 50, still another part of the conductive layer 20b, and still another part of the insulating layer 60b interposed therebetween. The second electrode portion 70d3 has a shape conformal to a wall of the second groove G2.

A relative position of the third bonding pad 70d1 with respect to the first bonding pad 70c1 is equal to a relative position of the fourth bonding pad 70d2 with respect to the second bonding pad 70c2. Here, as an example, it is supposed that an orthogonal projection of the second bonding pad 70c2 onto a plane perpendicular to the Z direction overlaps an orthogonal projection of the first bonding pad 70c1 onto this plane, and an orthogonal projection of the fourth bonding pad 70d2 onto the aforementioned plane overlaps an orthogonal projection of the third bonding pad 70dl onto this plane.

The first external electrode 70c and the second external electrode 70d may each have a single-layer structure or a multi-layer structure. Each layer constituting the first external electrode 70c and the second external electrode 70d is made of, for example, a metal such as molybdenum, aluminum, gold, tungsten, platinum, copper, nickel, or an alloy containing one or more of them.

A thickness of the first external electrode 70c and the second external electrode 70d is preferably within a range of 0.1 μm to 1000 μm, and more preferably within a range of 1 μm to 500 μm.

This capacitor 1 is manufactured, for example, by the following method. Hereinafter, an example of a method of manufacturing the capacitor 1 will be described with reference to FIGS. 11 to 17.

Figure 11:
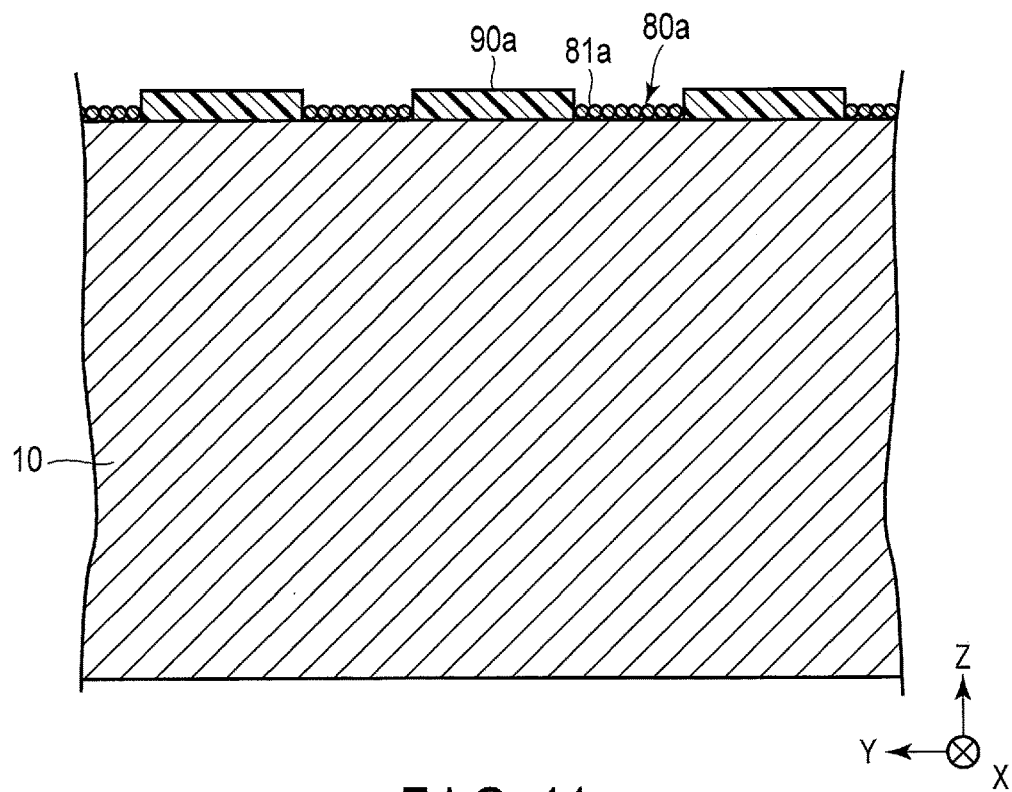
FIG. 11 is a cross-sectional view showing a process in the manufacture of the capacitor shown in FIGS. 1 to 10.

In this method, the substrate 10 shown in FIG. 11 is first prepared. Here, as an example, it is supposed that the substrate 10 is a single-crystal silicon wafer. A plane orientation of the single-crystal silicon wafer is not particularly limited, but in this example, a silicon wafer whose main surface is a (100) plane is used. As the substrate 10, a silicon wafer whose main surface is a (110) plane can also be used.

Next, the through holes are formed in the substrate 10 by MacEtch (Metal-Assisted Chemical Etching).

Figure 12:
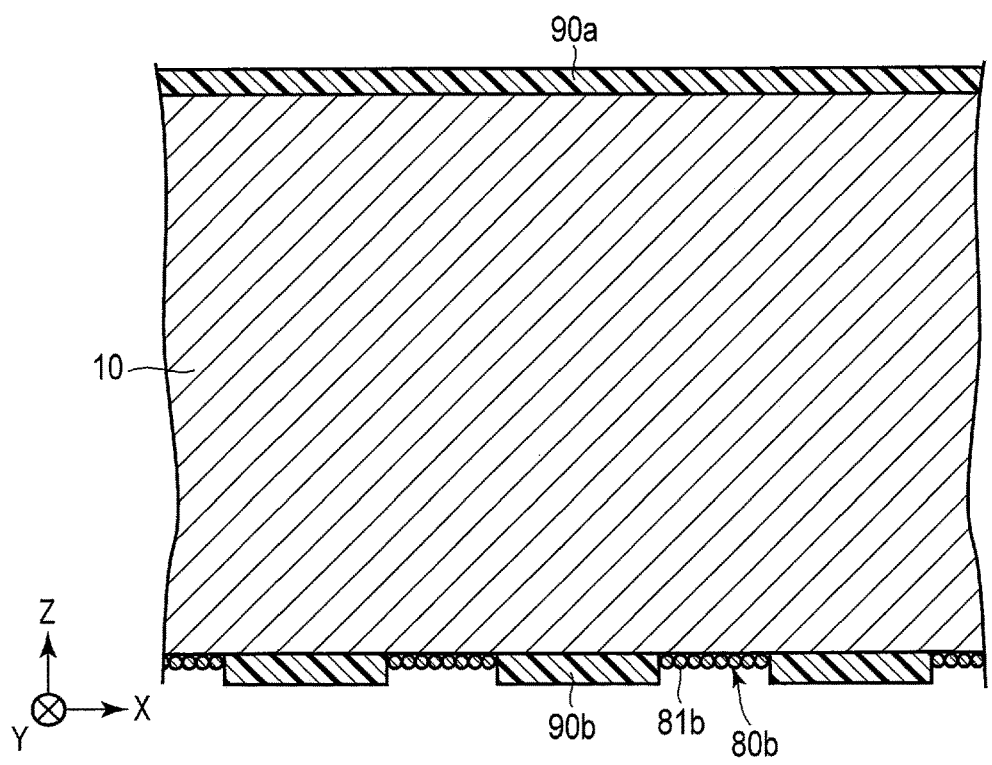
FIG. 12 is a cross-sectional view showing another process in the manufacture of the capacitor shown in FIGS. 1 to 10.

That is, as shown in FIGS. 11 and 12, a first catalyst layer 80a and a second catalyst layer 80b each containing a first noble metal are first formed on the substrate 10. The first catalyst layer 80a and the second catalyst layer 80b are formed so as to partially cover one main surface (hereinafter, referred to as the first surface) of the substrate 10 and the other main surface (hereinafter, referred to as the second surface), respectively.

Specifically, a first mask layer 90a is first formed on the first surface of the substrate 10.

The first mask layer 90a is opened at positions corresponding to the first recesses R1. The first mask layer 90a prevents a noble metal to be described later from coming into contact with portions of the first surface that are covered with the first mask layer 90a.

Examples of the material of the first mask layer 90a include organic materials such as polyimide, fluororesin, phenol resin, acrylic resin, and novolac resin, and inorganic materials such as silicon oxide and silicon nitride.

The first mask layer 90a can be formed by, for example, existing semiconductor processes. The first mask layer 90a made of an organic material can be formed by, for example, photolithography. The first mask layer 90a made of an inorganic material can be formed by, for example, deposition of an inorganic material layer by vapor deposition, formation of a mask by photolithography, and patterning of the inorganic material layer by etching. Alternatively, the first mask layer 90a made of an inorganic material can be formed by oxidation or nitriding of the surface region of the substrate 10, formation of a mask by photolithography, and patterning of an oxide or nitride layer by etching. The first mask layer 90a can be omitted.

Next, the first catalyst layer 80a is formed on regions of the first surface that are not covered with the first mask layer 90a. The first catalyst layer 80a is, for example, a discontinuous layer containing a noble metal. Here, as an example, it is supposed that the first catalyst layer 80a is a particulate layer formed of first catalyst particles 81a containing a noble metal.

The noble metal is, for example, one or more of gold, silver, platinum, rhodium, palladium, and ruthenium. The first catalyst layer 80a and the first catalyst particles 81a may further contain a metal other than a noble metal, such as titanium.

The first catalyst layer 80a can be formed by, for example, electroplating, reduction plating, or displacement plating. The first catalyst layer 80a may also be formed by application of a dispersion containing noble metal particles, or vapor deposition such as evaporation or sputtering. Of these methods, the displacement plating is particularly favorable because it is possible to directly and evenly deposit the noble metal on regions of the main surface that are not covered with the first mask layer 90a.

Next, as shown in FIG. 12, a second mask layer 90b is formed on the second surface.

The second mask layer 90b is opened at positions corresponding to the second recesses R2. The second mask layer 90b prevents the noble metal from coming into contact with portions of the second surface that are covered with the second mask layer 90b.

As a material of the second mask layer 90b, for example, those exemplified for the first mask layer 90a can be used. The second mask layer 90b can be formed, for example, by the same method as described above for the first mask layer 90a.

Next, the second catalyst layer 80b is formed on each of the regions of the second surface that are not covered with the second mask layer 90b. The second catalyst layer 80b is, for example, a discontinuous layer containing a noble metal. Here, as an example, it is supposed that the second catalyst layer 80b is a particulate layer formed of second catalyst particles 81b containing a noble metal.

As materials of the second catalyst layer 80b and the second catalyst particles 81b, for example, those exemplified for the first catalyst layer 80a and the first catalyst particles 81a can be used. The second catalyst layer 80b can be formed, for example, by the same method as described above for the first catalyst layer 80*a*.

It is possible that, after forming the first mask layer 90*a* on the first main surface, the second mask layer 90*b* is formed on the second main surface, and subsequently, the first catalyst layer 80*a* is formed, and then the second catalyst layer 80*b* is formed. It is also possible that, after forming the first mask layer 90*a* on the first main surface, the second mask layer 90*b* is formed on the second main surface, and after that, the substrate is immersed in a plating solution so that the first catalyst layer 80*a* and the second catalyst layer 80*b* are formed at the same time.

Next, the substrate 10 is etched with an assist from a noble metal as a catalyst to form holes corresponding to the through holes shown in FIG. 8 in the substrate 10.

Specifically, as shown in FIGS. 13 and 14, the substrate 10 is etched with an etching agent 100. For example, the substrate 10 is immersed in the etching agent 100 in liquid form to bring the etching agent 100 into contact with the substrate 10.

The etching agent 100 contains an oxidizer and hydrogen fluoride.

The concentration of hydrogen fluoride in the etching agent 100 is preferably within a range of 1 mol/L to 20 mol/L, more preferably within a range of 5 mol/L to 10 mol/L, and further preferably within a range of 3 mol/L to 7 mol/L. When the hydrogen fluoride concentration is low, it is difficult to achieve a high etching rate. When the hydrogen fluoride concentration is high, excess side etching may occur.

The oxidizer can be selected from, for example, hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(N_3)_2$, $Na_2S_2O_8$, $K_2S_2O_8$, $KMnO_4$, and $K_2Cr_2O_7$. Hydrogen peroxide is favorable as the oxidizer because no harmful byproduct is produced and a semiconductor element is not contaminated.

The concentration of the oxidizer in the etching agent 100 is preferably within a range of 0.2 mol/L to 8 mol/L, more preferably within a range of 2 mol/L to 4 mol/L, and further preferably within a range of 3 mol/L to 4 mol/L.

The etching agent 100 may further contain a buffer. The buffer contains, for example, at least one of ammonium fluoride and ammonia. As an example, the buffer is ammonium fluoride. As another example, the buffer is a mixture of ammonium fluoride and ammonia.

The etching agent 100 may further contain other components such as water.

When such an etching agent 100 is used, the material of the substrate 10, i.e. silicon in this example, is oxidized only in regions of the substrate 10 that are close to the first catalyst particles 81*a* or the second catalyst particles 81*b*. Oxide generated thereby is dissolved and removed by hydrofluoric acid. Therefore, only the portions close to the first catalyst particles 81*a* or the second catalyst particles 81*b* are selectively etched.

The first catalyst particles 81*a* move toward the second surface with the progress of etching, where etching similar to the above is performed. As a result, as shown in FIG. 13, at the position of the first catalyst layer 80*a*, etching proceeds from the first surface toward the second surface in a direction perpendicular to the first surface.

On the other hand, the second catalyst particles 81*b* move toward the first surface with the progress of etching, where etching similar to the above is performed. As a result, as shown in FIG. 14, at the position of the second catalyst layer 80*b*, etching proceeds from the second surface toward the first surface in a direction perpendicular to the second surface.

Figure 16:
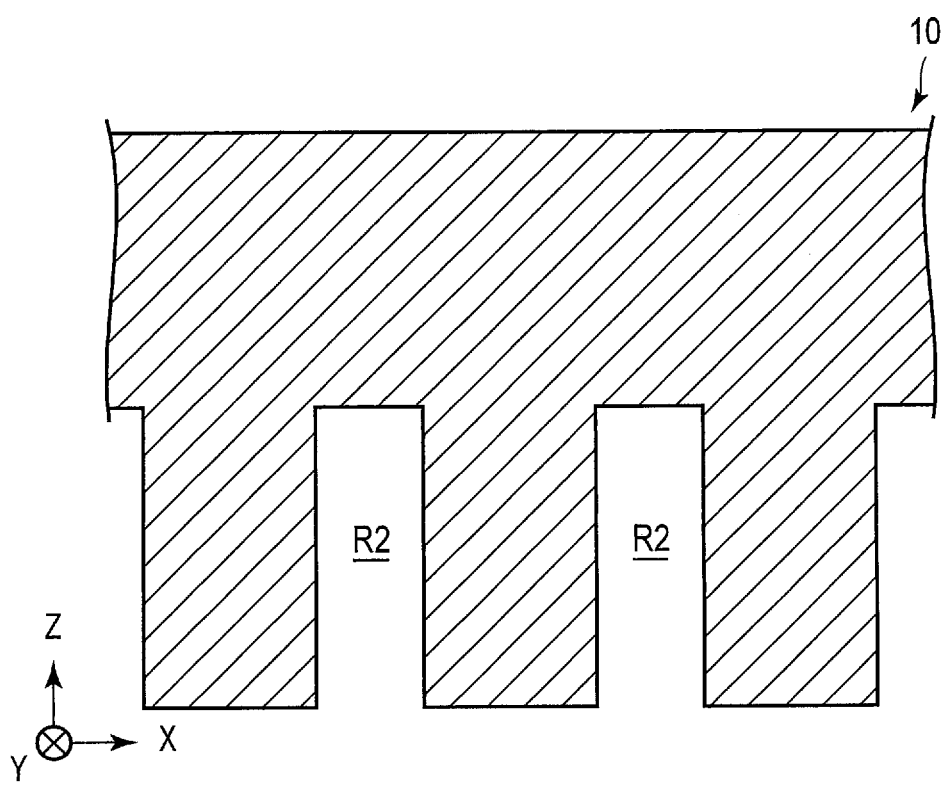
FIG. 16 is another cross-sectional view showing the structure obtained by the processes of FIGS. 13 and 14.
Figure 17:
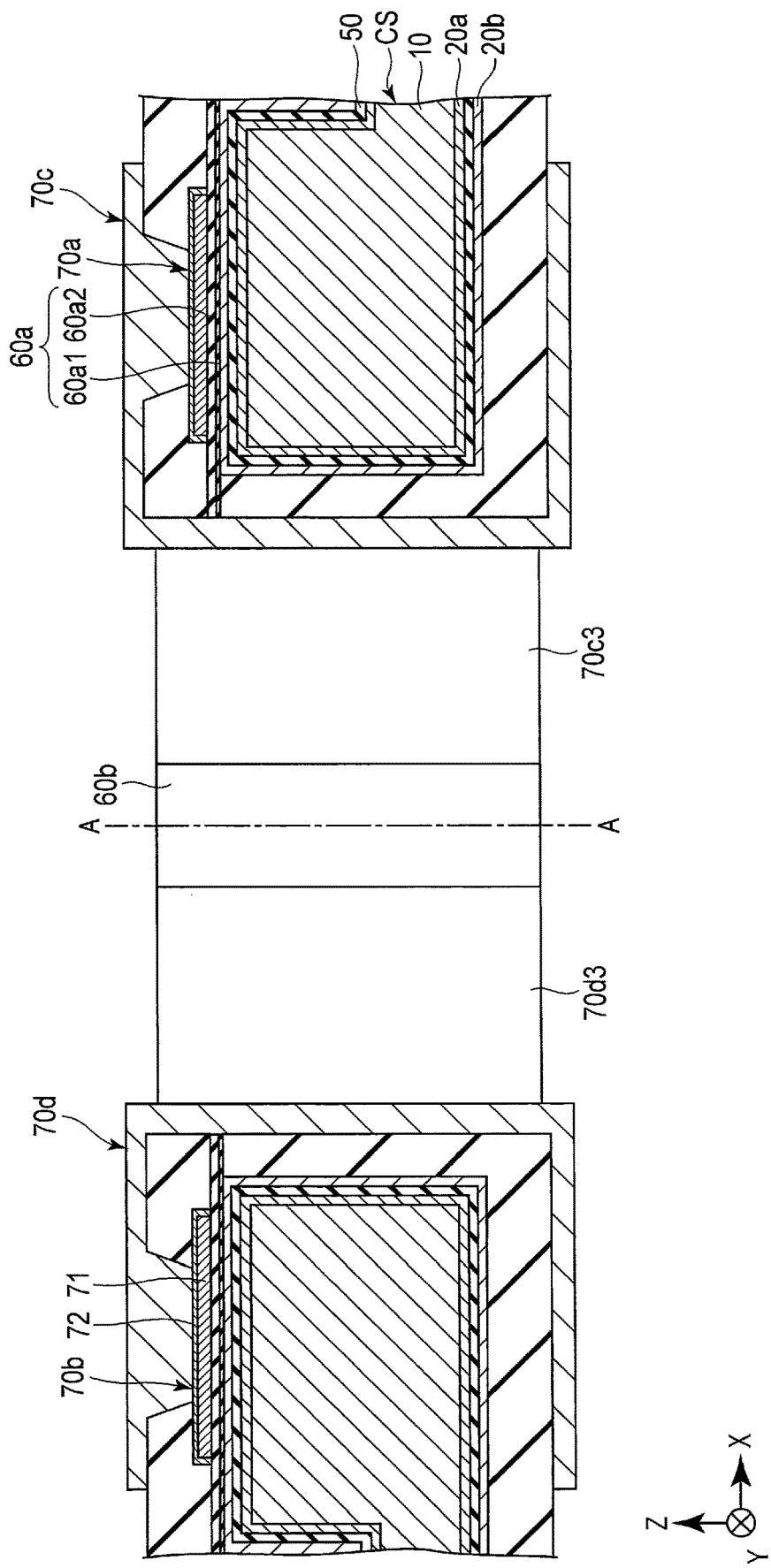
FIG. 17 is a cross-sectional view showing still another process in the manufacture of the capacitor shown in FIGS. 1 to 10.

In this way, as shown in FIGS. 15 and 16, recesses corresponding to the first recesses R1 are formed on the first surface, and recesses corresponding to the second recesses R2 are formed on the second surface. When a sum of the depths of these recesses is equal to or more than the thickness of the substrate 10, these recesses are connected together at positions where they intersect. In this way, the through holes are formed at the above intersections.

In addition, at the same time as forming these recesses, recesses are also formed on the first surface and the second surface at positions corresponding to the first groove G1 and the second groove G2. Thereby, the through holes are formed at the positions of the substrate 10 corresponding to the first groove G1 and the second groove G2.

Here, each of these through holes is circular in cross section perpendicular to its length direction. This cross section may have other shapes, such as a rectangle.

Thereafter, the first mask layer 90*a*, the second mask layer 90*b*, the first catalyst layer 80*a*, and the second catalyst layer 80*b* are removed from the substrate 10. One or more of the first mask layer 90*a*, the second mask layer 90*b*, the first catalyst layer 80*a*, and the second catalyst layer 80*b* may not be removed from the substrate 10.

Next, the conductive layer 20*a* shown in FIGS. 3 to 10 is formed on the substrate 10 to obtain the conductive substrate CS. In the case where the conductive layer 20*a* is made of polysilicon, such a layer can be formed by, for example, LPCVD (low pressure chemical vapor deposition). In the case where the conductive layer 20*a* is made of metal, such a layer can be formed by, for example, electrolytic plating, reduction plating, or displacement plating.

A plating solution is a liquid containing a salt of a metal to be plated. As the plating solution, a general plating solution, such as a copper sulfate plating solution containing copper sulfate pentahydrate and sulfuric acid, a copper pyrophosphate plating solution containing copper pyrophosphate and potassium pyrophosphate, and a nickel sulfamate plating solution containing nickel sulfamate and boron, can be used.

The conductive layer 20*a* is preferably formed by a plating method using a plating solution containing a salt of a metal to be plated, a surfactant, and carbon dioxide in a supercritical or subcritical state. In this plating method, the surfactant is interposed between particles of supercritical carbon dioxide and a continuous phase of a solution containing a salt of a metal to be plated. That is, the surfactant is allowed to form micelles in the plating solution, and supercritical carbon dioxide is incorporated in these micelles.

In a normal plating method, the supply of the metal to be plated may be insufficient in the vicinity of the bottom portions of the recesses. This is particularly noticeable when a ratio D/W of the depth D to a width or diameter W of the recesses is large.

The micelles that have incorporated supercritical carbon dioxide can easily enter narrow gaps. As the micelles move, the solution containing a salt of a metal to be plated also moves. Therefore, according to a plating method using a plating solution containing a salt of a metal to be plated, a surfactant, and carbon dioxide in a supercritical or subcritical state, the conductive layer 20*a* having a uniform thickness can be easily formed.

Next, the dielectric layer 50 is formed on the conductive layer 20*a*. The dielectric layer 50 can be formed by, for example, CVD (chemical vapor deposition). Alternatively, the dielectric layer 50 can be formed by oxidizing, nitriding, or oxynitriding the surface of the conductive layer 20a.

Next, the conductive layer 20b is formed on the dielectric layer 50. The conductive layer 20b can be formed, for example, by the same method as described above for the conductive layer 20a. The conductive layer 20b is also preferably formed by a plating method using a plating solution containing a salt of a metal to be plated, a surfactant, and carbon dioxide in a supercritical or subcritical state.

Next, a plurality of through holes are formed in a stacked body including the conductive layer 20b and the dielectric layer 50. Here, these through holes are formed in a portion of the above stacked body that is on the first main surface S1, at positions corresponding to intersections of the second recesses R2 and regions each sandwiched between two adjacent first recesses R1 such that the through holes are arranged every other position in the Y direction. These through holes can be formed by, for example, formation of a mask by photolithography and patterning by etching.

Next, the first insulating layer 60a1 is formed on the fifth portion P5 and the seventh portions P7 of the conductive layer 20b. The first insulating layer 60a1 can be formed by, for example, CVD.

Thereafter, the second insulating layer 60a2 is formed on the first insulating layer 60a1. The second insulating layer 62a2 is provided with through holes at the positions of the through holes provided in the above stacked body. When a photosensitive resin is used as the material of the second insulating layer 60a2, the second insulating layer 60a2 having the through holes can be obtained using photolithography.

Next, the first insulating layer 60a1 is etched using the second insulating layer 60a2 as an etching mask. Thereby, a portion of the first insulating layer 60a1 that covers the conductive layer 20a is removed.

Next, a first metal layer 71 and a second metal layer 72 are stacked in this order and patterned to obtain the first comb-shaped electrode 70a and the second comb-shaped electrode 70b. The first comb-shaped electrode 70a and the second comb-shaped electrode 70b can be formed by, for example, a combination of film formation by sputtering or plating, and photolithography.

Thereafter, the insulating layer 60b is formed on the conductive layer 20b, the insulating layer 60a, and the second metal layer 72. The insulating layer 60b is provided with through holes at the positions corresponding to the first comb-shaped electrode 70a and the second comb-shaped electrode 70b. The insulating layer 60b can be formed, for example, by the method described above for the insulating layer 60a.

Next, the first external electrode 70c and the second external electrode 70d are formed on the insulating layer 60b. The first external electrode 70c and the second external electrode 70d can be formed, for example, by the method described above for the first comb-shaped electrode 70a and the second comb-shaped electrode 70b. In the manner described above, the structure shown in FIG. 17 is obtained.

Thereafter, this structure is diced along a line A-A. That is, the structure is diced in such a manner that some of the dicing lines are lines of the through holes, which are provided corresponding to the first groove G1 and the second groove G2, extending in the X direction, and the remainders of the dicing lines are lines of the through holes extending in the Y direction.

In a structure prior to performing this dicing, it is preferable that the first external electrode 70c and the second external electrode 70d are not connected to each other at the position of the line A-A, or alternatively, the first external electrode 70c and the second external electrode 70d are connected to each other at the position of the line A-A and are thinner at that position than the other positions. This makes it possible to prevent generation of undesired damage in the first external electrode 70c and the second external electrode 70d due to the dicing.

In the manner described above, the capacitor 1 shown in FIGS. 1 to 10 is obtained.

In this capacitor 1, the stacked structure including the dielectric layer 50 and the conductive layer 20b is provided not only on the first main surface S1 but also on the second main surface S2 and in the through holes TH. Therefore, this capacitor 1 can achieve a large electric capacitance.

In addition, in this capacitor 1, the first recesses R1 and the second recesses R2 are trenches. The above-described stacked structure is also provided on the side walls and the bottom surfaces of the trenches. Therefore, this capacitor 1 can achieve a particularly large electric capacitance.

In addition, in this capacitor 1, the first recesses R1 and the second recesses R2 intersect each other, and a sum of their depths is equal to or more than the thickness of the conductive substrate CS. Thus, when the first recesses R1 and the second recesses R2 are formed, the through holes TH are generated at the positions where they intersect. Therefore, there is no need to further perform a step of forming the through holes TH in addition to the step of forming the first recesses R1 and the second recesses R2.

In this capacitor 1, an electrical connection between the portions of the above stacked structure that are located on the first main surface S1 and the second main surface S2 is performed using the through holes TH. Thus, both of the first comb-shaped electrode 70a and the second comb-shaped electrode 70b can be disposed on one side of the capacitor 1. The capacitor 1 adopting such a configuration can be manufactured in a relatively small number of process steps.

Furthermore, this capacitor 1 makes it possible to easily increase an electric capacitance per mounting area as will be described below.

FIG. 18 is a cross-sectional view showing an example of a capacitor module including the above-described capacitor 1.

A capacitor module 150 shown in FIG. 18 includes a circuit substrate 110 and a plurality of capacitors 1.

The circuit substrate 110 includes an insulating substrate 111 and conductor patterns 112. The circuit substrate 110 here includes the conductor patterns 112 only on its outermost surface. The circuit substrate 110 may be a multi-layer substrate.

Each of a plurality of capacitors 1 has the structure described with reference to FIGS. 1 to 10. Those capacitors 1 are stacked one on top of another. The first external electrodes 70c of two adjacent ones of them are electrically connected together, and the second external electrodes 70d of the two adjacent ones of them are electrically connected together. Here, two capacitors 1 are stacked in such a manner that the first bonding pad 70c1 and the third bonding pad 70d1 of one capacitor face the second bonding pad 70c2 and the fourth bonding pad 70d2 of the other capacitor, respectively. In addition, in this stacked body, the capacitors 1 are stacked in such a manner that the first grooves G1 are arranged in the length direction thereof to form a single groove, and the second grooves G2 are arranged in the length direction thereof to form another single groove. These capacitors 1 are fixed to each other by an adhesive layer 130b interposed therebetween.

This stacked body is mounted on the circuit substrate 110 in such a manner that the second bonding pad 70c2 and the fourth bonding pad 70d2 of one capacitor 1 face one of the two conductor patterns 112 and the other conductor pattern 112, respectively. This stacked body is supported by the circuit substrate 110. Here, this stacked body is fixed to the circuit substrate 110 by the adhesive layer 130a interposed between the stacked body and the insulating substrate 111.

This capacitor module 150 further includes a plurality of bonding materials 120. These bonding materials 120 are made of, for example, conductive materials such as solder.

One of the bonding materials 120 is provided so as to be in contact with the first electrode portions 70c3 of the two capacitors 1 and the conductor pattern 112. This bonding material 120 extends over approximately the entire length of the single groove formed by connecting the first grooves G1 of the plurality of capacitors 1. In addition, this bonding material 120 includes a portion positioned in a gap between the first bonding pad 70c1 and the second bonding pad 70c2 of adjacent capacitors 1 and a portion positioned in a gap between the conductor pattern 112 and the second bonding pad 70c2. According to an example, this bonding material 120 forms a fillet. This bonding material 120 ensures an electrical connection between the first external electrodes 70c of the stacked capacitors 1 and an electrical connection between these first external electrodes 70c and the conductor pattern 112.

The other one of the bonding materials 120 is provided so as to be in contact with the second electrode portions 70d3 of the two capacitors 1 and the other conductor pattern 112. This bonding material 120 extends over approximately the entire length of the single groove formed by connecting the second grooves G2 of the plurality of capacitors 1. In addition, this bonding material 120 includes a portion positioned in a gap between the third bonding pad 70d1 and the fourth bonding pad 70d2 of adjacent capacitors 1 and a portion positioned in a gap between the conductor pattern 112 and the fourth bonding pad 70d2. According to an example, this bonding material 120 forms a fillet. This bonding material 120 ensures an electrical connection between the second external electrodes 70d of the stacked capacitors 1 and an electrical connection between these second external electrodes 70d and the other conductor pattern 112.

In this capacitor module 150, the capacitors 1 are stacked in their thickness direction. Accordingly, when this structure is adopted, it is easy to increase an electric capacitance per mounting area.

In addition, in each of the capacitors 1 included in this capacitor module 150, the first external electrode 70c and the second external electrode 70d respectively include the first electrode portion 70c3 and the second electrode portion 70d3 each facing the end faces S3. Thus, for example, an electrical connection between the first external electrodes 70c, an electrical connection between the second external electrodes 70d, an electrical connection between the first external electrode 70c and the conductor pattern 112, and an electrical connection between the second external electrode 70d and the conductor pattern 112 are realizable at the same time by forming the bonding materials 120. Accordingly, in this point also, adopting the above-described structure makes it easy to increase an electric capacitance per mounting area.

Furthermore, in this capacitor module 150, the capacitors 1 are stacked in such a manner that the first grooves G1 are arranged in the length direction thereof to form a single groove, and the second grooves G2 are arranged in the length direction thereof to form another single groove. Thus, in the case where solder is used as the material of the bonding materials 120, solder melted by heating can spread over substantially the entire length of the above-described grooves by capillary action. Accordingly, in this point also, adopting the above-described structure makes it easy to increase an electric capacitance per mounting area.

Second Embodiment

Figure 19:
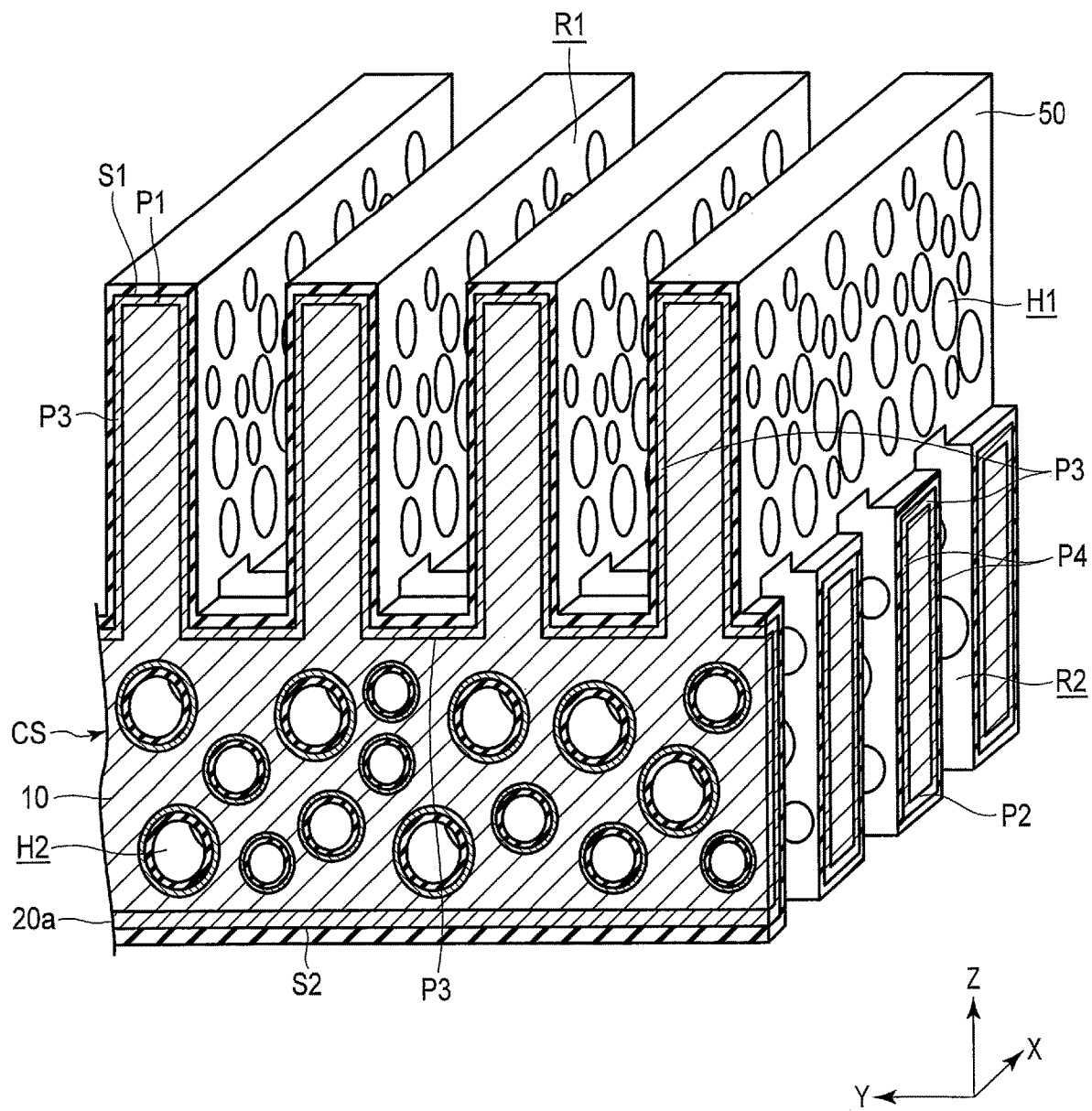
FIG. 19 is a perspective view showing a part of a capacitor according to a second embodiment.

FIG. 19 shows a part of a capacitor according to a second embodiment.

The capacitor according to the second embodiment is the same as the capacitor 1 according to the first embodiment except for adopting the following configuration. In addition, a capacitor module according to the second embodiment is the same as the capacitor module 150 according to the first embodiment except for adopting the following configuration in the capacitor.

That is, in the capacitor according to the second embodiment, one or more first holes H1 are provided on the side walls of the first recesses R1, and one or more second holes H2 are provided on the side walls of the second recesses R2.

Each of the first holes H1 may be a blind hole that extends from one of two adjacent ones of two or more first recesses R1 and does not reach the other. Alternatively, each of the first holes H1 may be a through hole that connects two adjacent ones of two or more first recesses R1 to each other. Alternatively, one or more of the first holes H1 may be blind holes, and the rest of the first holes H1 may be through holes.

Each of the second holes H2 may be a blind hole that extends from one of two adjacent ones of two or more second recesses R2 and does not reach the other. Alternatively, each of the second holes H2 may be a through hole that connects two adjacent ones of two or more second recesses R2 to each other. Alternatively, one or more of the second holes H2 may be blind holes, and the rest of the second holes H2 may be through holes.

In addition, in this capacitor, the stacked structure including the dielectric layer 50 and the conductive layer 20b is provided not only on the first main surface S1, the second main surface S2, and the side walls and the bottom surfaces of the first recesses R1 and the second recesses R2, but also on side walls of the first holes H1 and side walls of the second holes H2. That is, the conductive layer 20b further faces the side walls of the first holes H1 and the side walls of the second holes H2, in addition to facing the first main surface S1, the second main surface S2, and the side walls and the bottom surfaces of the first recesses R1 and the second recesses R2 with the dielectric layer 50 interposed therebetween.

The capacitor according to the second embodiment can be obtained by, for example, performing the processes for forming the first holes H1 and the second holes H2 in the manufacture of the capacitor 1 according to the first embodiment. The first holes H1 and the second holes H2 can be formed by, for example, the following method.

That is, the structure described with reference to FIGS. 15 and 16 is first prepared. Next, as shown in FIG. 20, a second catalyst layer containing a second noble metal is formed on the substrate 10 so as to partially cover the side walls of the first recesses R1 and the side walls of the second recesses R2.

Note that reference symbol 82a and 82b represent catalyst particles in FIG. 20. As materials of the catalyst particles 82a and 82*b*, for example, those exemplified for the first catalyst particles 81*a* and the second catalyst particles 81*b* can be used.

Next, holes corresponding to the first holes H1 and the second holes H2 are formed by the MacEtch. That is, the substrate 10 is etched with an assist from a noble metal as a catalyst to form the holes corresponding to the first holes H1 and the second holes H2.

Thereafter, the conductive layer 20*a*, the dielectric layer 50, the conductive layer 20*b*, etc. are formed by the same method as described in the first embodiment. In this way, the capacitor according to the second embodiment is obtained.

In this capacitor, the first holes H1 are provided on the side walls of the first recesses R1, and the second holes H2 are provided on the side walls of the second recesses R2. Accordingly, the conductive substrate CS of this capacitor has a larger surface area than that of a substrate with no hole provided on the side walls of the first recesses R1 and the second recesses R2.

In this capacitor, the stacked structure of the dielectric layer 50 and the conductive layer 20*b* is provided not only on the first main surface S1, the second main surface S2, and the side walls and the bottom surfaces of the first recesses R1 and the second recesses R2, but also on the side walls of the first holes H1 and the second holes H2. Accordingly, this capacitor can achieve a larger electric capacitance than the capacitor 1 with no hole provided on the side walls of the first recesses R1 and the second recesses R2.

The capacitor and the capacitor module according to the second embodiment have the same effects as those of the capacitor 1 and the capacitor module 150 according to the first embodiment, respectively. The capacitor and the capacitor module according to the second embodiment can achieve a larger electric capacitance than the capacitor 1 and the capacitor module 150 according to the first embodiment.

An average diameter of the first holes H1 is preferably 0.3 μm or more. When the diameter of the first holes H1 is reduced, more first holes H1 can be arranged, thereby achieving a larger electric capacitance. However, if the diameter of the first holes H1 is reduced too much, there is a possibility that it may be difficult to form the stacked structure of the dielectric layer 50 and the conductive layer 20*b* in the first holes H1.

A proportion of a total area of openings of the first holes H1 in an area of a side wall of the first recess R1, which is hereinafter referred to as an aperture ratio, is preferably within a range of 30% to 90%, and more preferably within a range of 50% to 90%. In addition, a ratio of the number of the first holes H1 provided on a side wall of the first recess R1 to an area of the side wall, which is hereinafter referred to as a hole density, is preferably within a range of $0.4/\mu m^2$ to $20/\mu m^2$, and more preferably within a range of $2/\mu m^2$ to $8/\mu m^2$.

When the aperture ratio and the hole density are increased, a larger electric capacitance can be achieved. However, when the aperture ratio and the hole density are increased too much, there is a possibility that it may be difficult to form the stacked structure of the dielectric layer 50 and the conductive layer 20*b* in the first holes H1.

A distance between adjacent first recesses R1 is preferably 0.1 μm or more, and more preferably 2 μm or more. When this distance is increased, a larger electric capacitance can be achieved. However, since a rate of increase in electric capacitance with respect to this distance gradually decreases as the distance increases, it is not effective to excessively increase the above distance. If this distance is increased, there is a possibility that it may be difficult to form the stacked structure of the dielectric layer 50 and the conductive layer 20*b* in the first holes H1.

An average diameter of the second holes H2 is preferably 0.3 μm or more. When the diameter of the second holes H2 is reduced, more second holes H2 can be arranged, thereby achieving a larger electric capacitance. However, if the diameter of the second holes H2 is reduced too much, there is a possibility that it may be difficult to form the stacked structure of the dielectric layer 50 and the conductive layer 20*b* in the second holes H2.

A proportion of a total area of openings of the second holes H2 in an area of a side wall of the second recess R2, which is hereinafter referred to as an aperture ratio, is preferably within a range of 30% to 90%, and more preferably within a range of 50% to 90%. A ratio of the number of the second holes H2 provided on a side wall of the second recess R2 to an area of the side wall, which is hereinafter referred to as a hole density, is preferably within a range of $0.4/\mu m^2$ to $20/\mu m^2$, and more preferably within a range of $2/\mu m^2$ to $8/\mu m^2$.

When the aperture ratio and the hole density are increased, a larger electric capacitance can be achieved. However, when the aperture ratio and the hole density are increased too much, there is a possibility that it may be difficult to form the stacked structure of the dielectric layer 50 and the conductive layer 20*b* in the second holes H2.

A distance between adjacent second recesses R2 is preferably 0.1 μm or more, and more preferably 2 μm or more. When this distance is increased, a larger electric capacitance can be achieved. However, since a rate of increase in electric capacitance with respect to this distance gradually decreases as the distance increases, it is not effective to excessively increase the above distance. If this distance is increased, there is a possibility that it may be difficult to form the stacked structure of the dielectric layer 50 and the conductive layer 20*b* in the second holes H2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the above-described embodiments, the first comb-shaped electrode 70*a* and the second comb-shaped electrode 70*b* are arranged to face one surface of the conductive substrate CS, but the first comb-shaped electrode 70*a* and the second comb-shaped electrode 70*b* may be arranged to face each other with the conductive substrate CS interposed therebetween.

In the above-described embodiments, the first comb-shaped electrode 70*a* and the second comb-shaped electrode 70*b* are provided as internal electrodes, but the internal electrodes may have other shapes. In addition, the first comb-shaped electrode 70*a* and the second comb-shaped electrode 70*b* may be omitted, and the first external electrode 70*c* and the second external electrode 70*d* may be connected to the conductive layer 20*b* and the conductive substrate CS, respectively.

The first bonding pad 70*c*1, the second bonding pad 70*c*2, the third bonding pad 70*d*1, and the fourth bonding pad 70*d*2 may be omitted. Alternatively, the first electrode portion 70*c*3 and the second electrode portion 70*d*3 may be omitted.

The first recesses R1 and the second recesses R2 may be formed with such depths that the through holes TH are not formed. In addition, either the first recesses R1 or the second recesses R2 may be omitted.

Furthermore, in the above-described embodiments, the first recesses R1 and the second recesses R2 are formed using MacEtch, but may be formed using reactive ion etching (RIE).

The invention claimed is:

1. A capacitor comprising:
a conductive substrate having a first main surface, a second main surface, and an end face extending from an edge of the first main surface to an edge of the second main surface, the first main surface being provided with one or more recesses;
a conductive layer covering the first main surface and side walls and bottom surfaces of the one or more recesses;
a dielectric layer interposed between the conductive substrate and the conductive layer;
a first external electrode including a first electrode portion that faces the end face, the first external electrode being electrically connected to the conductive layer; and
a second external electrode including a second electrode portion that faces the end face, the second external electrode being electrically connected to the conductive substrate,
wherein the one or more recesses are one or more first trenches, one or more second trenches are provided on the second main surface, and the conductive layer further covers the second main surface, and side walls and bottom surfaces of the one or more second trenches.

2. The capacitor according to claim 1, wherein the end face is provided with first and second grooves each extending from the edge of the first main surface to the edge of the second main surface, and the first and second electrode portions are respectively arranged in the first and second grooves.

3. The capacitor according to claim 2, wherein the first and second electrode portions respectively have shapes conformal to walls of the first and second grooves.

4. The capacitor according to claim 1, wherein the first external electrode further includes first and second bonding pads respectively facing the first and second main surfaces, and the second external electrode further includes third and fourth bonding pads respectively facing the first and second main surfaces.

5. The capacitor according to claim 4, wherein the first bonding pad is connected to one end of the first electrode portion, the second bonding pad is connected to the other end of the first electrode portion, the third bonding pad is connected to one end of the second electrode portion, and the fourth bonding pad is connected to the other end of the second electrode portion.

6. The capacitor according to claim 4, wherein a relative position of the third bonding pad with respect to the first bonding pad is equal to a relative position of the fourth bonding pad with respect to the second bonding pad.

7. The capacitor according to claim 1, wherein a length direction of the one or more first trenches and a length direction of the one or more second trenches intersect each other, and the one or more first trenches and the one or more second trenches are connected to each other at intersections thereof.

8. The capacitor according to claim 1, wherein the conductive substrate includes a substrate and a conductive layer provided on the substrate, and the substrate contains silicon.

9. A capacitor module comprising:
a stacked body including a plurality of capacitors stacked one on top of another, each of the plurality of capacitors being the capacitor according to claim 1, and two adjacent ones of the plurality of capacitors being such that the first external electrodes are electrically connected to each other and the second external electrodes are electrically connected to each other; and
a circuit substrate supporting the stacked body.

10. A capacitor module comprising:
a stacked body including a plurality of capacitors stacked one on top of another, each of the plurality of capacitors being the capacitor according to claim 1;
a circuit substrate supporting the stacked body;
a bonding material provided to be in contact with the first electrode portions of the plurality of capacitors and electrically connecting the first electrode portions together; and
a bonding material provided to be in contact with the second electrode portions of the plurality of capacitors and electrically connecting the second electrode portions together.

11. The capacitor module according to claim 10, wherein each of the bonding materials is made of solder.

12. A capacitor module comprising:
a stacked body including a plurality of capacitors stacked one on top of another, each of the plurality of capacitors comprising
a conductive substrate having a first main surface, a second main surface, and an end face extending from an edge of the first main surface to an edge of the second main surface, the first main surface being provided with one or more recesses,
a conductive layer covering the first main surface and side walls and bottom surfaces of the one or more recesses,
a dielectric layer interposed between the conductive substrate and the conductive layer,
a first external electrode including a first electrode portion that faces the end face, the first external electrode being electrically connected to the conductive layer, and
a second external electrode including a second electrode portion that faces the end face, the second external electrode being electrically connected to the conductive substrate, and
two adjacent ones of the plurality of capacitors being such that the first external electrodes are electrically connected to each other and the second external electrodes are electrically connected to each other; and
a circuit substrate supporting the stacked body.

13. A capacitor module comprising:
a stacked body including a plurality of capacitors stacked one on top of another, each of the plurality of capacitors comprising
a conductive substrate having a first main surface, a second main surface, and an end face extending from an edge of the first main surface to an edge of the second main surface, the first main surface being provided with one or more recesses,
a conductive layer covering the first main surface and side walls and bottom surfaces of the one or more recesses,
a dielectric layer interposed between the conductive substrate and the conductive layer, a first external electrode including a first electrode portion that faces the end face, the first external electrode being electrically connected to the conductive layer, and a second external electrode including a second electrode portion that faces the end face, the second external electrode being electrically connected to the conductive substrate;

a circuit substrate supporting the stacked body;

a bonding material provided to be in contact with the first electrode portions of the plurality of capacitors and electrically connecting the first electrode portions together; and a bonding material provided to be in contact with the second electrode portions of the plurality of capacitors and electrically connecting the second electrode portions together.

14. The capacitor module according to claim 13, wherein each of the bonding materials is made of solder.

* * * * *